(12) United States Patent
Choi

(10) Patent No.: US 12,293,087 B2
(45) Date of Patent: May 6, 2025

(54) APPARATUS AND METHOD FOR PROGRAMMING DATA IN A NON-VOLATILE MEMORY DEVICE

(71) Applicant: SK hynix Inc., Gyeonggi-do (KR)

(72) Inventor: Hyung Jin Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 231 days.

(21) Appl. No.: 17/989,857

(22) Filed: Nov. 18, 2022

(65) Prior Publication Data
US 2024/0028216 A1 Jan. 25, 2024

(30) Foreign Application Priority Data
Jul. 21, 2022 (KR) .......................... 10-2022-0090175

(51) Int. Cl.
G06F 3/06 (2006.01)
(52) U.S. Cl.
CPC .......... *G06F 3/0619* (2013.01); *G06F 3/0659* (2013.01); *G06F 3/0679* (2013.01)
(58) Field of Classification Search
CPC .... G06F 3/0619; G06F 3/0659; G06F 3/0679; G11C 11/5671; G11C 11/5628; G11C 16/08; G11C 16/24; G11C 16/3459; G11C 16/10; G11C 16/06; G11C 16/34; G11C 16/0483; G11C 16/3032; G11C 16/3418
See application file for complete search history.

(56) References Cited

U.S. PATENT DOCUMENTS

| | | | |
|---|---|---|---|
| 9,852,065 B1* | 12/2017 | Rajwade | G11C 16/0483 |
| 2010/0259993 A1* | 10/2010 | Kang | G11C 16/3454 |
| | | | 365/185.03 |
| 2023/0069260 A1* | 3/2023 | Lien | G11C 16/10 |

FOREIGN PATENT DOCUMENTS

KR 10-1946507 B1 2/2019

* cited by examiner

*Primary Examiner* — Hiep T Nguyen
(74) *Attorney, Agent, or Firm* — IP & T GROUP LLP

(57) ABSTRACT

A memory device includes plural memory cells and control circuitry. Each of the memory cells is capable of storing multi-bit data corresponding to an erase state and plural program states. The control circuitry is configured to divide plural program loops, which are performed to store the multi-bit data in the plural memory cells, into plural program groups and apply different program pulses, which correspond to each of the plural program groups, to the plural memory cells.

18 Claims, 14 Drawing Sheets

APPARATUS AND METHOD FOR PROGRAMMING DATA IN A NON-VOLATILE MEMORY DEVICE

CROSS-REFERENCE TO RELATED APPLICATIONS

This patent application claims the benefit of Korean Patent Application No. 10-2022-0090175, filed on Jul. 21, 2022, the entire disclosure of which is incorporated herein by reference.

TECHNICAL FIELD

One or more embodiments of the present disclosure described herein relate to a memory device, and more particularly, to an apparatus and a method for programming a data entry in a non-volatile memory device.

BACKGROUND

A data processing system includes a memory system or a data storage device. The data processing system can be developed to store more voluminous data in the data storage device, store data in the data storage device faster, and read data stored in the data storage device faster. The memory system or the data storage device can include non-volatile memory cells and/or volatile memory cells for storing data.

BRIEF DESCRIPTION OF THE DRAWINGS

The description herein makes reference to the accompanying drawings wherein like reference numerals refer to like parts throughout the figures.

DETAILED DESCRIPTION

Figure 1:
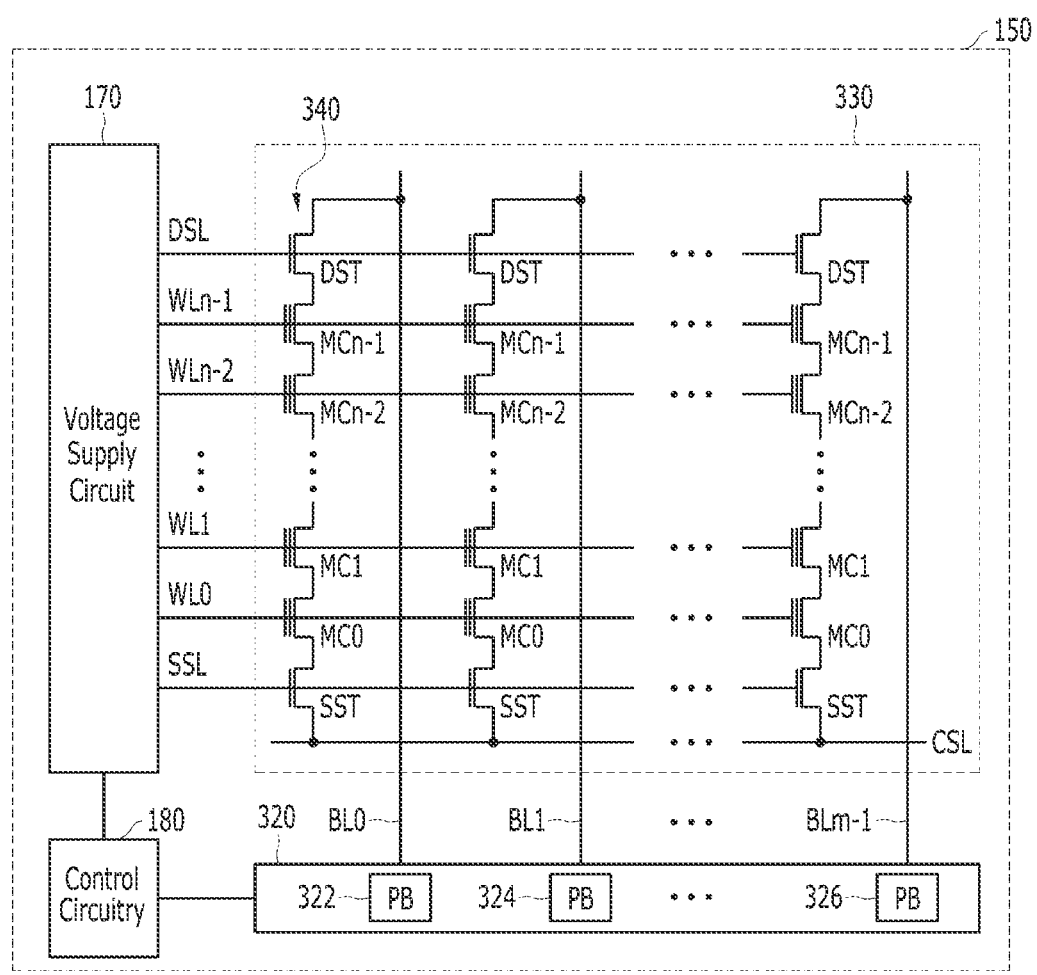
FIG. 1 illustrates a memory device according to an embodiment of the present disclosure.

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language include hardware—for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

As used in this disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that they precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

Embodiments described herein provide a data processing system and a method for operating the data processing system. The data processing system includes components and resources such as a memory system and a host, and is capable of dynamically allocating plural data paths used for data communication between the components based on usages of the components and the resources.

An embodiment of the present disclosure may provide an apparatus and method capable of improving a data input/output speed of a memory device.

In addition, an embodiment of the present disclosure can provide an apparatus and a method for performing a data program operation which can reduce or avoid a program disturb or an error occurred in a non-volatile memory device during the data program operation.

In an embodiment, a memory device can include plural memory cells, each of the memory cells capable of storing multi-bit data corresponding to an erase state and plural program states; and control circuitry configured to divide plural program loops, which are performed to store the multi-bit data in the plural memory cells, into plural program groups and apply different program pulses, which correspond to each of the plural program groups, to the plural memory cells.

The memory device can further include a voltage supply circuit configured to apply a program pulse to the plural memory cells during each of the plural program loops.

Each of the plural program loops can include a first operation to control bit lines coupled to the plural memory cells; a second operation to apply a program pulse corresponding to one of the plural program states to the plural memory cells; and a third operation to verify a program state of the plural memory cells, the program state corresponding to the program pulse.

The control circuitry can be configured to perform the plural program loops into one or more odd numbered program loops and one or more even numbered program loops.

The control circuit can be further configured to apply a program pulse regarding a first program state group including a program state closest to the erase state among the plural program states to the plural memory cells during the one or more odd numbered program loops, and apply another program pulse regarding a second program state group including a program state furthest from the erase state among the plural program states to the plural memory cells during the one or more even numbered program loops.

The first program state group and the second program state group can be mutually exclusive.

A program pulse set to program program states corresponding to LSB data of '1' among the multi-bit data can be applied to the plural memory cells during the one or more odd numbered program loops. Another program pulse set to program program states corresponding to LSB data of '0' among the multi-bit data can be applied to the plural memory cells during the one or more even numbered program loops.

The control circuitry can be further configured to: divide the plural memory cells into a first memory cell group and a second memory cell group before dividing the plural program loops into the plural program groups, wherein the first memory cell group includes a memory cell having a threshold voltage to be in the erase state, and the second memory cell group includes a memory cell having a threshold voltage to be in one of the plural program states; and apply a common program pulse corresponding to a program state closest to the erase state among the plural program states to the second memory cell group.

The control circuitry is further configured to: perform a verification regarding the common program pulse after applying the common program pulse to the second memory cell group; and determine whether the second memory cell group is defective based on a result of the verification.

The number of program states corresponding to program pulses applied during each of the plural program groups dividing the plural program loops can be the same, In another embodiment, a memory system can include a controller configured to determine a physical address corresponding to a write data entry and transfer the write data entry into a location corresponding to the physical address; and a memory device configured to divide plural program loops, which are performed to store multi-bit data included in the write data entry in plural memory cells, into plural program groups and apply different program pulses, which correspond to each of the plural program groups, to the plural memory cells.

The memory device can be further configured to transfer a completion notice to the controller after the multi-bit data is completely programmed in the plural memory cells. The controller can be further configured to generate a map data entry associating a logical address of the write data and the physical address.

Each of the plural program loops can include a first operation to control bit lines coupled to the plural memory cells; a second operation to apply a program pulse corresponding to one of plural program states to the plural memory cells; and a third operation to verify a program state of the plural memory cells, the program state corresponding to the program pulse.

The memory device can be configured to perform the plural program loops into one or more odd numbered program loops and one or more even numbered program loops.

The memory device can be further configured to apply a program pulse regarding a first program state group including a program state closest to an erase state among plural program states to the plural memory cells during the one or more odd numbered program loops, and apply another program pulse regarding a second program state group including a program state furthest to the erase state among the plural program states to the plural memory cells during the one or more even numbered program loops.

The first program state group and the second program state group can be mutually exclusive.

A program pulse set to program program states corresponding to LSB data of '1' among the multi-bit data can be applied to the plural memory cells during the one or more odd numbered program loops. Another program pulse set to program program states corresponding to LSB data of '0' among the multi-bit data can be applied to the plural memory cells during the one or more even numbered program loops.

The memory device can be further configured to: divide the plural memory cells into a first memory cell group and a second memory cell group before dividing the plural program loops into the plural program groups, wherein the first memory cell group includes a memory cell having a threshold voltage to be in an erase state, and the second memory cell group includes a memory cell having a threshold voltage to be in one of plural program states; and apply a common program pulse corresponding to a program state closest to the erase state among the plural program states to the second memory cell group.

The memory device can be further configured to: perform a verification regarding the common program pulse after applying the common program pulse to the second memory cell group; and determine whether the second memory cell group is defective based on a result of the verification.

In another embodiment, a method for operating a memory device can include dividing plural memory cells, configured to store multi-bit data corresponding to an erase state and plural program states, into a first memory cell group and a second memory cell group, wherein the first memory cell group includes a memory cell having a threshold voltage corresponding to an erase state, and the second memory cell group includes a memory cell having a threshold voltage corresponding to one of the plural program states; applying a common program pulse to the second memory cell group; dividing plural program loops, which are performed to store the multi-bit data in the second memory cell group, into plural program groups; applying different program pulses, which correspond to each of the plural program groups, to the second memory cell group; and terminating a program operation regarding the multi-bit data after verifications in the plural program groups succeed.

In another embodiment, a method for performing a program operation in a memory device can include applying a common program pulse to a memory cell group configured to be programmed to plural program states; and alternatively performing odd-numbered program loops and even-numbered program loops by applying different program pulses. The odd-numbered program loops correspond to a first program group of the plural program states, and the even-numbered program loops correspond to a second program group of the plural program states.

The alternatively performing can include alternatively applying high-potential program pulses during the odd-numbered program loops and low-potential program pulses during the even-numbered program loops.

The alternatively performing can include alternatively applying long-time program pulses during the odd-numbered program loops and short-time program pulses during the even-numbered program loops.

Embodiments will now be described with reference to the accompanying drawings, wherein like numbers reference like elements.

FIG. 1 illustrates a memory device 150 that includes a memory cell array circuit formed in a memory die according to an embodiment of the present disclosure.

Referring to FIG. 1, the memory device 150 may include at least one memory group 330 having a plurality of cell strings 340. Each cell string 340 may include a plurality of non-volatile memory cells $MC0$ to $MCn-1$ connected to a respective bit line of a plurality of bit lines $BL0$ to $BLm-1$. The cell strings 340 are disposed in respective columns of the memory group 330, and each cell string 340 can include at least one drain select transistor DST and at least one source select transistor SST. The non-volatile memory cells $MC0$ to $MCn-1$ of each cell string 340 may be connected in series between a drain select transistor DST and a source select transistor SST. Each of the non-volatile memory cells $MC0$ to $MCn-1$ may be configured as a multi-level cell (MLC) that stores a data item having plural bits per cell. The cell strings 340 may be electrically connected to corresponding bit lines of the bit lines $BL0$ to $BLm-1$.

In an embodiment, the memory group 330 may include NAND-type flash memory cells $MC0$ to $MCn-1$. In another embodiment, the memory group 330 can be implemented as a NOR-type flash memory, a hybrid flash memory in which at least two different types of memory cells are mixed or combined, or a one-chip NAND flash memory in which a controller is embedded in a single memory chip. In an embodiment, the memory group 330 can include a flash memory cell including a charge trap flash (CTF) layer that includes a conductive floating gate or insulating layer.

Figure 2:
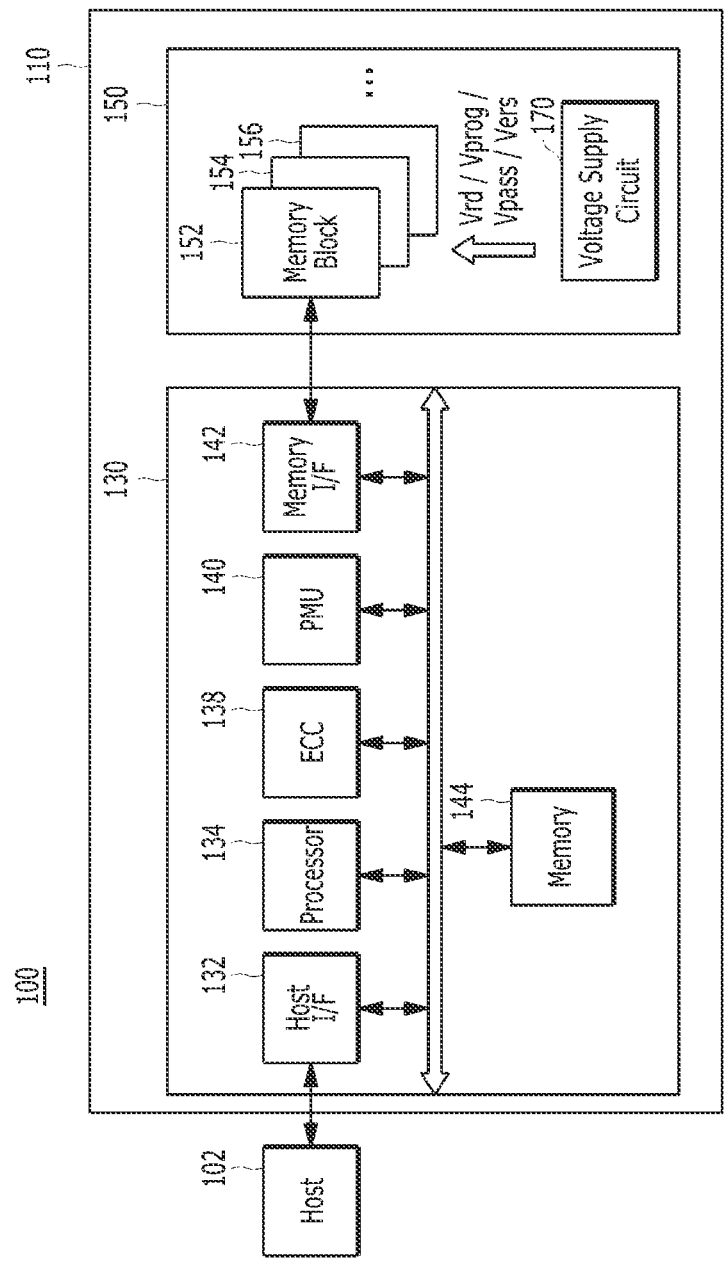
FIG. 2 illustrates a data processing system according to an embodiment of the present disclosure.

FIG. 2 shows a memory system 110 which may include the memory device 150 according to an embodiment of the present disclosure. In this embodiment, the memory group 330 in memory device 150 may include one or more memory blocks 152, 154, 156. According to an embodiment, the memory device 150 can have a two-dimensional (2D) or three-dimensional (3D) structure. For example, each of the memory blocks 152, 154, 156 in the memory device 150 may be implemented as a 3D structure, for example, a vertical structure. Each of the memory blocks 152, 154, 156 may have a three-dimensional structure extending along first to third directions, for example, an x-axis direction, a y-axis direction, and a z-axis direction.

The memory group 330 including the plurality of memory blocks 152, 154, 156 can be coupled to a plurality of bit lines BL, a plurality of string select lines SSL, a plurality of drain select lines DSL, a plurality of word lines WL, a plurality of dummy word lines DWL, and a plurality of common source lines CSL. In one embodiment, the memory group 330 can include a plurality of NAND strings NS which, for example, may respectively correspond to cell strings 340. Each NAND string NS may include a plurality of memory cells MC and may be connected to a respective bit line of the bit lines BL. In addition, the string select transistor SST of each NAND string NS may be connected to a common source line CSL, and the drain select transistor DST of each NAND string NS can be connected to a corresponding bit line BL. In each NAND string NS, the memory cells MC may be arranged between the string select transistor SST and the drain select transistor DST.

Referring to FIGS. 1 and 2, the memory device 150 may include a voltage supply circuit 170 which can supply a word line voltage (e.g., one or more predetermined voltages such as a program voltage), a read voltage, and a pass voltage, for respective word lines of the word lines according to an operation mode, or may supply a voltage to a bulk (e.g., a well region), in which each memory block including the memory cells MC are formed. In this case, a voltage generating operation of the voltage supply circuit 170 may be performed under control of control circuitry 180. Also, the voltage supply circuit 170 may generate a plurality of variable read voltages having different levels to distinguish a plurality of data items from each other.

In response to control of the control circuitry 180, one of the memory blocks (or sectors) of the memory cell array may be selected, and one of the word lines of the selected memory block may be selected. Word line voltages may be supplied to the selected word line and the unselected word line, individually. The voltage supply circuit 170 may include a voltage generation circuit (e.g., refer to FIGS. 4 to 8) for generating target voltages having various levels.

In an embodiment, the voltage supply circuit 170 may be coupled to a first pin or pad receiving a first power voltage VCC applied from an external source (e.g., an external device), and a second pin or pad receiving the second power voltage VPP applied from the external source. The second power voltage VPP may have a greater voltage level (e.g., twice or more higher) than that of the first power voltage VCC. For example, the first power voltage VCC may have a voltage level of 2.0V to 5.5V, while the second power supply voltage may have a voltage level of 9V to 13V.

According to an embodiment, the voltage supply circuit 170 can include a voltage generation circuit for more rapidly generating the target voltages of various levels used in the memory group 330. The voltage generation circuit can use the second power supply voltage VPP to generate a target voltage, which may have a higher voltage level than the second power voltage VPP.

The memory device 150 may also include a read/write circuit 320 controlled by the control circuitry 180. The read/write circuit 320 may operate as a sense amplifier or a write driver according to an operation mode. For example, in a verify operation and a read operation, the read/write circuit 320 may operate as a sense amplifier for reading the data item from the memory cell array. In a program operation, the read/write circuit 320 may operate as a write driver that controls potentials of bit lines according to a data item to be stored in the memory cell array. The read/write circuit 320 may receive the data item to be programmed to the cell array from page buffers during the program operation. The read/write circuit 320 can drive bit lines based on the input data item. To this end, the read/write circuit 320 may include a plurality of page buffers (PB) 322, 324, 326, with each page buffer corresponding to each column or each bit line, or each column pair or each bit line pair. According to an embodiment, a plurality of latches may be included in each of the page buffers 322, 324, 326.

The page buffers 322, 324, 326 may be coupled to a data input/output device (e.g., a serialization circuit or a serializer) through a plurality of buses BUS. When each of the page buffers 322, 324, 326 is coupled to the data input/output device through different buses, a delay that may occur in data transmission from the page buffers 322, 324, 326 can be reduced. For example, each page buffer 322, 324, 326 can perform the data transmission without a waiting time.

According to an embodiment, the memory device 150 may receive a write command, write data, and information (e.g., a physical address) regarding a location in which the write data is to be stored. The control circuitry 180 causes the voltage supply circuit 170 to generate a program pulse, a pass voltage, etc., used for a program operation performed in response to a write command. The control circuitry 180 may also cause the voltage supply circuit 170 to generate one or more voltages used for a verification operation performed after the program operation.

When a multi-bit data item is programmed in non-volatile memory cells included in the memory group 330, the error rate might be higher than that when a single-bit data item is stored in the non-volatile memory cells. For example, an error in the non-volatile memory cells may be induced due to cell-to-cell interference (CCI). In order to reduce error in the non-volatile memory cells, a width (deviation) of a threshold voltage distribution, corresponding to stored data items between the non-volatile memory cells, should be reduced.

To this end, the memory device 150 can perform an incremental step pulse programming (ISPP) operation to effectively make a narrow threshold voltage distribution of the non-volatile memory cells. In an embodiment, the memory device 150 can use the ISPP operation for multi-step program operations. For example, the memory device 150 may divide a program operation into a Least Significant Bit (LSB) program operation and a Most Significant Bit (MSB) operation according to a predetermined order between the non-volatile memory cells or pages.

According to an embodiment, it is possible to provide an apparatus and method which is capable of reducing a time for discharging a bit line or a channel between program pulse applications during a data programming operation, accomplished by applying a plurality of program pulses to memory cells in a memory device. When the discharge time is reduced, the speed of the program operation of the memory device may be increased. For example, in order to discharge a bit line or a channel in the memory device, the memory device can control or adjust the voltage level of a bit line select line or a drain select line (DSL), in order to avoid that a transistor becomes in a floating state when controlled through the bit line select line or the drain select line (DSL). When the transistor is in a floating state, the bit line or channel may not be able to be discharged appropriately.

In an embodiment, a memory device can adjust and change a setup time for adjusting the potential of a bit line after applying a program pulse during a unit programming operation, in which a program pulse to memory cell is applied to a non-volatile memory cell in the memory device. As a result, it is possible to provide an apparatus and method that is capable of increasing the speed of the program operation and/or improving program operation efficiency.

For example, during an operation of applying a plurality of program pulses to non-volatile memory cells in the memory device (in order to program the non-volatile memory cells with multi-bit data), the memory device can perform a unit program operation in which a second program pulse is applied after a first program pulse has been applied, in one of various modes.

The modes of the unit program operation can include a first program mode, a second program mode, and a third program mode. In the first program mode, the degree to which data is programmed in response to the second program pulse (e.g., a change or a shift of threshold voltage in a non-volatile memory cell when the second program pulse is applied) may be similar to or greater than the degree to which data is programmed in response to the first program pulse. In the second program mode, the degree to which data is programmed in response to the second program pulse is smaller than the degree to which data is programmed in response to the first program pulse. In the third program mode, the degree to which data is programmed in response to the second program pulse is non-existent, e.g., there is no change or no shift of the threshold voltage in the non-volatile memory cell even when the second program pulse is applied. The mode could be achieved based on the potential of the bit line coupled to a target memory cell when a program pulse is applied. If the discharge time can be reduced, the memory device can improve the efficiency or speed of the data program operation by adjusting and changing the setup time used to change or discharge the potential of the bit line.

According to an embodiment, the memory device can change or adjust a control voltage applied through the bit line select line or the drain select line (DSL) in response to a program operation environment (e.g., temperature and a level or a size) or the number of applications regarding a program pulse applied to non-volatile memory cells during the data program operation. Accordingly, the memory device may reduce an operation margin corresponding to each program pulse during the data programming operation. This may be accomplished by applying a plurality of program pulses to a non-volatile memory cell. As a result, the time spent on performing the data programming operation may be reduced.

Referring again to FIG. 2, the memory device 150 is shown as included in a data processing system 100. According to an embodiment, the data processing system 100 may include a host 102 engaged or coupled with a memory system, such as memory system 110. For example, the host 102 and the memory system 110 can be coupled to each other via a data bus, a host cable, and the like, to perform data communication.

The memory system 110 may include the memory device 150 and a controller 130. The memory device 150 and the controller 130 may be considered components or elements physically separated from each other. The memory device 150 and the controller 130 may be connected via at least one data path. For example, the data path may include a channel and/or a way.

According to an embodiment, the memory device 150 and the controller 130 may be components or elements that are functionally divided. Further, according to an embodiment, the memory device 150 and the controller 130 may be implemented in a single chip or in a plurality of chips. The controller 130 may perform a data input/output operation in response to a request input from the external device. For example, when the controller 130 performs a read operation in response to a read request input from an external device, data stored in a plurality of non-volatile memory cells included in the memory device 150 is transferred to the controller 130.

Also, in FIG. 2, the memory device 150 may include one or more memory blocks 152, 154, 156. The memory blocks 152, 154, 156 may be understood as a group of non-volatile memory cells in which data is removed together by a single erase operation. The memory blocks 152, 154, 156 may include at least one page, e.g., a group of non-volatile memory cells that store data together during a single program operation and/or that output data together during a single read operation. For example, one memory block may include a plurality of pages.

In an embodiment, the memory device 150 may include a plurality of memory planes or one or more memory dies. According to an embodiment, the memory plane may be considered a logical or a physical partition including at least one memory block, a driving circuit capable of controlling an array of a plurality of non-volatile memory cells, and a buffer that can temporarily store data input to, or output from, non-volatile memory cells.

According to an embodiment, each memory die may include at least one memory plane and may be understood as a set of components implemented on a physically distinguishable substrate. Each memory die may be connected to the controller 130 through a data path, and may include an interface to exchange an item of data and a signal with the controller 130.

According to an embodiment, the memory device 150 may include at least one memory block 152, 154, 156, at least one memory plane, or at least one memory die. The internal configuration of the memory device 150 (e.g., shown in FIG. 1) may be different according to performance of the memory system 110. Embodiments of the present disclosure are not limited to the internal configuration shown in FIG. 2.

In FIG. 2, the memory device 150 includes the voltage supply circuit 170 which is capable of supplying one or more voltages to the memory block(s) 152, 154, 156. The voltage supply circuit 170 can include a voltage generation circuit for generating target voltages for the memory block(s) 152, 154, 156, for example, as described with reference to FIGS. 4 to 8.

In an embodiment, the voltage supply circuit 170 may supply a read voltage Vrd, a program voltage Vprog, a pass voltage Vpass, or an erase voltage Vers into a non-volatile memory cell included in the memory block. For example, during a read operation for reading data stored in the non-volatile memory cell in the memory block(s) 152, 154, 156, the voltage supply circuit 170 may supply the read voltage Vrd to a selected non-volatile memory cell. During the program operation for storing data in the non-volatile memory cell in the memory block(s) 152, 154, 156, the voltage supply circuit 170 may supply the program voltage Vprog into a selected non-volatile memory cell. During a read operation or a program operation performed on the selected non-volatile memory cell, the voltage supply circuit 170 may supply a pass voltage Vpass to a non-selected non-volatile memory cell. During the erasing operation for erasing data stored in the non-volatile memory cell in the memory block(s) 152, 154, 156, the voltage supply circuit 170 may supply the erase voltage Vers to the memory block.

The memory device 150 may store information regarding various voltages which are supplied to the memory block(s) 152, 154, 156 based on which operation is performed. For example, when a non-volatile memory cell in the memory block(s) 152, 154, 156 can store multi-bit data, plural levels of the read voltage Vrd may be used for recognizing or reading the multi-bit data item. The memory device 150 may include a table with information indicating plural levels of the read voltage Vrd corresponding to the multi-bit data item. For example, the table can include bias values stored in a register, with each bias value corresponding to a specific level of the read voltage Vrd. The number of bias values for the read voltage Vrd used for a read operation may be limited to a preset range. Also, in an embodiment, the bias values can be quantized.

The host 102 may include a portable electronic device (e.g., a mobile phone, an MP3 player, a laptop computer, etc.) or a non-portable electronic device e.g., a desktop computer, a game player, a television, a projector, etc. According to an embodiment, the host 102 can include a central processing unit (CPU) included in the portable electronic device and the non-portable electronic device.

The host 102 may include at least one operating system (OS), which can control functions and operations performed in the host 102. The OS can provide interoperability between the host 102 engaged operatively with the memory system 110 and a user who intends to store data in the memory system 110. The OS may support functions and operations corresponding to user requests. By way of example but not limitation, the OS can be classified into a general operating system and a mobile operating system according to mobility of the host 102. The general operating system may be split into a personal operating system and an enterprise operating system according to system requirements or a user environment. As compared with the personal operating system, the enterprise operating systems can be specialized for securing and supporting high performance computing.

The mobile operating system may be subject to support services or functions for mobility, e.g., a power saving function. The host 102 may include a plurality of operating systems and may execute multiple operating systems interlocked with the memory system 110, corresponding to a user request. The host 102 may transmit a plurality of commands corresponding to user requests to the memory system 110, thereby performing operations corresponding to the plurality of commands within the memory system 110.

The controller 130 may control the memory device 150 in response to a request or a command from the host 102. For example, the controller 130 may perform a read operation to provide data read from the memory device 150 to the host 102 and may perform a write operation (for example, a program operation) to store data input from the host 102 in the memory device 150. In order to perform data input/output (I/O) operations, the controller 130 may control and manage internal operations of reading data, programming data, erasing data, or the like.

According to an embodiment, the controller 130 may include a host interface (I/F) 132, a processor 134, error correction circuitry (ECC) 138, a power management unit (PMU) 140, a memory interface (I/F) 142, and a memory 144. Components in the controller 130 as illustrated in FIG. 2 may vary according to structures, functions, operation performance, or the like, regarding the memory system 110.

For example, the memory system 110 may be implemented with any of various types of storage devices electrically coupled with the host 102 according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like. Components may be added to or omitted from the controller 130 according to implementation of the memory system 110.

Each of the host 102 and the memory system 110 may include a controller or an interface for transmitting and receiving signals, data, and the like, in accordance with one or more predetermined protocols. For example, the host interface 132 in the memory system 110 may include an apparatus capable of transmitting signals, data, and the like to the host 102 or receiving signals, data, and the like from the host 102.

The host interface 132 may receive signals, commands (or requests), and/or data input from the host 102. For example, the host 102 and the memory system 110 may use a predetermined protocol to transmit and receive data therebetween. Examples of communication standards or interfaces supported by the host 102 and the memory system 110 for sending and receiving data include Universal Serial Bus (USB), Multi-Media Card (MMC), Parallel Advanced Technology Attachment (PATA), Small Computer System Interface (SCSI), Enhanced Small Disk Interface (ESDI), Integrated Drive Electronics (IDE), Peripheral Component Interconnect Express (PCIe or PCI-e), Serial-attached SCSI (SAS), Serial Advanced Technology Attachment (SATA), Mobile Industry Processor Interface (MIPI), and the like. According to an embodiment, the host interface 132 is a type of layer for exchanging data with the host 102 and is implemented with, or driven by, firmware called a host interface layer (HIL).

The Integrated Drive Electronics (IDE) or Advanced Technology Attachment (ATA) may be used as one of the interfaces for transmitting and receiving data and, for example, may use a cable including a predetermined number of (e.g., 40) wires connected in parallel to support data transmission and data reception between the host 102 and the memory system 110. When a plurality of memory systems 110 are connected to a single host 102, the plurality of memory systems 110 may be divided into a master and a slave using a position or a dip switch to which the plurality of memory systems 110 are connected. The memory system 110 set as the master may be used as a main memory device. The IDE (ATA) may include, for example, Fast-ATA, ATAPI, or Enhanced IDE (EIDE).

A Serial Advanced Technology Attachment (SATA) interface is a type of serial data communication interface that is compatible with various ATA standards of parallel data communication interfaces used by Integrated Drive Electronics (IDE) devices. The 40 wires in the IDE interface can be reduced to six wires in the SATA interface. For example, parallel signals for the IDE can be converted into 6 serial signals for the SATA interface. The SATA interface has been widely used because of its faster data transmission and reception rate and its less resource consumption in the host 102 used for the data transmission and reception. The SATA interface may connect up to 30 external devices to a single transceiver included in the host 102. In addition, the SATA interface can support hot plugging that allows an external device to be attached to or detached from the host 102, even while data communication between the host 102 and another device is being executed. Thus, the memory system 110 can be connected or disconnected as an additional device, like a device supported by a universal serial bus (USB), even when the host 102 is powered on. For example, in the host 102 having an eSATA port, the memory system 110 may be freely attached to or detached from the host 102 like an external hard disk.

Small Computer System Interface (SCSI) is a type of serial data communication interface used for connecting a computer or a server with other peripheral devices. The SCSI can provide high transmission speed compared with other interfaces such as IDE and SATA. In the SCSI, the host 102 and at least one peripheral device (e.g., memory system 110) are connected in series, but data transmission and reception between the host 102 and each peripheral device may be performed through a parallel data communication. In the SCSI, it is easy to connect or disconnect a device such as the memory system 110 to or from the host 102. The SCSI can support connections of 15 other devices to a single transceiver included in host 102.

Serial Attached SCSI (SAS) can be understood as a serial data communication version of the SCSI. In SAS, the host 102 and a plurality of peripheral devices are connected in series, and data transmission and reception between the host 102 and each peripheral device may be performed in a serial data communication scheme. Also, SAS can support connection between the host 102 and the peripheral device through a serial cable instead of a parallel cable, to easily manage equipment using the SAS and enhance or improve operational reliability and communication performance. Also, SAS may support connections of eight external devices to a single transceiver included in the host 102.

The Non-volatile memory express (NVMe) is a type of interface based at least on a Peripheral Component Interconnect Express (PCIe) designed to increase performance and design flexibility of the host 102, servers, computing devices, and the like equipped with the non-volatile memory system 110. PCIe can use a slot or a specific cable for connecting a computing device (e.g., host 102) and a peripheral device e.g., memory system 110. For example, PCIe can use a plurality of pins (e.g., 18 pins, 32 pins, 49 pins, or 82 pins) and at least one wire (e.g., x1, x4, x8, or x16) to achieve high speed data communication over several hundred MB per second e.g., 250 MB/s, 500 MB/s, 984.6250 MB/s, or 1969 MB/s. According to an embodiment, a PCIe scheme may achieve bandwidths of tens to hundreds of Giga bits per second. NVMe can support an operation speed of the non-volatile memory system 110, such as an SSD, that is faster than a hard disk.

According to an embodiment, the host 102 and the memory system 110 may be connected through a universal serial bus (USB). The Universal Serial Bus (USB) is a type of scalable, hot-pluggable plug-and-play serial interface that can provide cost-effective standard connectivity between the host 102 and peripheral devices, e.g., a keyboard, a mouse, a joystick, a printer, a scanner, a storage device, a modem, a video camera, and the like. A plurality of peripheral devices such as the memory system 110 may be coupled to a single transceiver included in the host 102.

The error correction circuitry 138 can correct error bits of data read from the memory device 150, and may include an error correction code (ECC) encoder and an ECC decoder. The ECC encoder may perform error correction encoding of data to be programmed in the memory device 150 in order to generate encoded data into which a parity bit is added. The encoded data may be stored in memory device 150. The ECC decoder can detect and correct error bits contained in the data read from the memory device 150 when the controller 130 reads the data stored in the memory device 150. For example, after performing error correction decoding on the data read from the memory device 150, the error correction circuitry 138 determines whether the error correction decoding has succeeded or not and outputs an instruction signal (e.g., a correction success signal or a correction fail signal) based on a result of the error correction decoding. The error correction circuitry 138 may use a parity bit generated during the ECC encoding process for the data stored in the memory device 150, in order to correct the error bits of the read data. When the number of the error bits is greater than or equal to the number of correctable error bits, the error correction circuitry 138 may not correct the error bits and instead may output the correction fail signal indicating failure in correcting the error bits.

According to an embodiment, the error correction circuitry 138 may perform an error correction operation based on coded modulation. Examples include a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), or the like. The error correction circuitry 138 may include all circuits, modules, systems, and/or devices for performing the error correction operation based on at least one of the above described codes. In an embodiment, the error correction circuitry 138 can include at least some of the components in the controller 130 shown in FIG. 1.

The ECC decoder may perform hard decision decoding or soft decision decoding on data transmitted from the memory device 150. Hard decision decoding can be understood as one of two methods broadly classified for error correction. Hard decision decoding may include, for example, an operation of correcting an error bit by reading digital data of '0' or '1' from a non-volatile memory cell in the memory device 150. Because the hard decision decoding handles a binary logic signal, the circuit/algorithm design or configuration may be simpler and processing speed may be faster than the soft decision decoding.

Soft decision decoding may quantize a threshold voltage of a non-volatile memory cell in the memory device 150 by two or more quantized values (e.g., multiple bit data, approximate values, an analog value, and the like) in order to correct an error bit based on the two or more quantized values. The controller 130 can receive two or more alphabets or quantized values from a plurality of non-volatile memory cells in the memory device 150, and then perform decoding based on information generated by characterizing the quantized values as a combination of information such as conditional probability or likelihood.

According to an embodiment, the ECC decoder may use low-density parity-check and generator matrix (LDPC-GM) code among methods designed for the soft decision decoding. A low-density parity-check (LDPC) code uses an algorithm that can read values of data from the memory device 150 in several bits according to reliability, not simply data of 1 or 0 like the hard decision decoding, and iteratively repeats it through a message exchange in order to improve reliability of the values. Then, the values are finally determined as data of 1 or 0. For example, a decoding algorithm using LDPC codes can be understood as probabilistic decoding. Hard decision decoding in which a value output from a non-volatile memory cell is coded as 0 or 1.

Compared to hard decision decoding, soft decision decoding can determine the value stored in the non-volatile memory cell based on the stochastic information. Regarding bit-flipping which may be considered an error that can occur in the memory device 150, soft decision decoding may provide improved probability of correcting the error and recovering data, as well as providing reliability and stability of corrected data. The LDPC-GM code may have a scheme in which internal low-density generator matrix (LDGM) codes can be concatenated in series with high-speed LDPC codes.

According to an embodiment, the ECC decoder may use, for example, low-density parity-check convolutional codes (LDPC-CCs) for the soft decision decoding. The LDPC-CCs may correspond to a scheme using linear time encoding and pipeline decoding based on a variable block length and a shift register.

According to an embodiment, the ECC decoder may use, for example, a Log Likelihood Ratio Turbo Code (LLR-TC)

for soft decision decoding. A Log Likelihood Ratio (LLR) may be calculated as a non-linear function for a distance between a sampled value and an ideal value. In addition, a Turbo Code (TC) may include a simple code (for example, a Hamming code) in two or three dimensions and repeat decoding in a row direction and a column direction to improve reliability of values.

The power management unit (PMU) 140 may control electrical power provided to the controller 130. The PMU 140 may monitor the electrical power supplied to the memory system 110 (e.g., a voltage supplied to the controller 130) and provide the electrical power to components included in the controller 130. The PMU 140 may not only detect power-on or power-off, but may also generate a trigger signal to enable the memory system 110 to urgently back up a current state when the electrical power supplied to the memory system 110 is unstable. According to an embodiment, the PMU 140 may include a device or a component capable of accumulating electrical power that may be used in an emergency.

The memory interface 142 may serve as an interface for handling commands and data transferred between the controller 130 and the memory device 150, in order to allow the controller 130 to control the memory device 150 in response to a command or a request input from the host 102. When the memory device 150 is a flash memory, the memory interface 142 may generate a control signal for the memory device 150 and may process data input to, or output from, the memory device 150 under the control of the processor 134.

For example, when the memory device 150 includes a NAND flash memory, the memory interface 142 includes a NAND flash controller (NFC). The memory interface 142 can provide an interface for handling commands and data between the controller 130 and the memory device 150. In accordance with an embodiment, the memory interface 142 can be implemented through, or driven by, firmware called a Flash Interface Layer (FIL) for exchanging data with the memory device 150.

According to an embodiment, the memory interface 142 may support an open NAND flash interface (ONFi), a toggle mode, or the like, for data input/output with the memory device 150. For example, the ONFi may use a data path (e.g., a channel, a way, etc.) that includes at least one signal line capable of supporting bi-directional transmission and reception in a unit of 8-bit or 16-bit data. Data communication between the controller 130 and the memory device 150 can be achieved through at least one interface regarding an asynchronous single data rate (SDR), a synchronous double data rate (DDR), a toggle double data rate (DDR), or the like.

The memory 144 may be used as a working memory of the memory system 110 or the controller 130, while temporarily storing transactional data of operations performed in the memory system 110 and the controller 130. For example, the memory 144 may temporarily store read data output from the memory device 150 in response to a read request from the host 102 before the read data is output to the host 102.

In addition, the controller 130 may temporarily store write data input from the host 102 in the memory 144 before programming the write data in the memory device 150. When the controller 130 controls operations such as a data read operation, a data write or program operation, a data erase operation, etc., of the memory device 150, data transmitted between the controller 130 and the memory device 150 of the memory system 110 may be temporarily stored in the memory 144.

In addition to the read data or write data, the memory 144 may store information (e.g., map data, read requests, program requests, etc.) used for inputting or outputting data between the host 102 and the memory device 150. According to an embodiment, the memory 144 may include one or more of a command queue, a program memory, a data memory, a write buffer/cache, a read buffer/cache, a data buffer/cache, a map buffer/cache, and so on. The controller 130 may allocate some storage space in the memory 144 for a component which is established to carry out a data input/output operation. For example, the write buffer established in the memory 144 may be used to temporarily store target data subject to a program operation.

In an embodiment, the memory 144 may be implemented with a volatile memory. For example, the memory 144 may be implemented with a static random access memory (SRAM), a dynamic random access memory (DRAM), or both. Although FIG. 2 illustrates that the memory 144 disposed within the controller 130, embodiments are not limited thereto. The memory 144 may be located within or external to the controller 130. For instance, the memory 144 may be embodied by an external volatile memory having a memory interface for transferring data and/or signals between the memory 144 and the controller 130.

The processor 134 may control overall operations of the memory system 110. For example, the processor 134 can control a program operation or a read operation of the memory device 150 in response to a write request or a read request entered from the host 102. According to an embodiment, the processor 134 may execute firmware to control the program operation or the read operation in the memory system 110. The firmware may be, for example, a flash translation layer (FTL). According to an embodiment, the processor 134 may be implemented with a microprocessor, a central processing unit (CPU), or another processing device.

According to an embodiment, the memory system 110 may be implemented with at least one multi-core processor. The multi-core processor is a type of circuit or chip in which two or more cores, which are considered distinct processing regions, are integrated. For example, when a plurality of cores in the multi-core processor drive or execute a plurality of flash translation layers (FTLs) independently, data input/output speed or performance of the memory system 110 may be improved. According to an embodiment, the data input/output (I/O) operations in the memory system 110 may be independently performed through different cores in the multi-core processor.

The processor 134 in the controller 130 may perform an operation corresponding to a request or a command input from the host 102. Further, the memory system 110 may perform an operation independent from a command or a request input from the host 102. In one case, an operation performed by the controller 130 in response to the request or the command input from the host 102 may be considered a foreground operation, while an operation performed by the controller 130 independently from the request or the command input from the host 102 may be considered a background operation. The controller 130 can perform foreground or background operations for reading, writing, or erasing data in the memory device 150. In addition, a parameter set operation corresponding to a set parameter command or a set feature command as a set command transmitted from the host 102 may be considered a foreground operation. Examples of background operations that may be performed by controller 130 without a command transmitted from the host 102 include garbage collection (GC), wear leveling (WL), bad block management for identifying and processing bad blocks, or the like.

According to an embodiment, substantially similar operations may be performed as both the foreground operation and the background operation. For example, when the memory system 110 performs garbage collection in response to a request or a command input from the host 102 (e.g., manual GC), the garbage collection can be considered a foreground operation. When the memory system 110 performs garbage collection independently of the host 102 (e.g., auto GC), the garbage collection can be considered a background operation.

When the memory device 150 includes a plurality of dies or a plurality of chips, each including a plurality of non-volatile memory cells, the controller 130 may perform parallel processing regarding plural requests or commands input from the host 102 in order to improve performance of the memory system 110. For example, the transmitted requests or commands may be divided into plural groups including at least some of a plurality of planes, a plurality of dies, or a plurality of chips included in the memory device 150. The plural groups of requests or commands are processed individually or in parallel in each plane, each die or each chip.

The memory interface 142 in the controller 130 may be connected to the plurality of dies or chips in the memory device 150 through at least one channel and at least one way. When the controller 130 distributes and stores data in the plurality of dies through each channel or each way in response to requests or commands associated with a plurality of pages including non-volatile memory cells, a plurality of operations corresponding to the requests or the commands can be performed simultaneously or in parallel in the plurality of dies or planes. Such a processing method or scheme can be considered as an interleaving method. Because a data input/output speed of the memory system 110 increases by operating with the interleaving method, data I/O performance of the memory system 110 can be improved.

By way of example but not limitation, the controller 130 can recognize statuses of a plurality of channels or ways associated with the plurality of dies included in the memory device 150. The controller 130 may determine the status of each channel or each way as one of a busy status, a ready status, an active status, an idle status, a normal status, or an abnormal status. The determination of which channel or way an instruction and/or data is delivered through by the controller 130 can be associated with a physical block address. The controller 130 may refer to descriptors delivered from the memory device 150. The descriptors may include a block or page of parameters describing something about the memory device 150. The descriptors can have a predetermined format or structure. For instance, the descriptors may include device descriptors, configuration descriptors, unit descriptors, and the like. The controller 130 may refer to, or use, the descriptors to determine which channel(s) or way(s) is used to exchange an instruction or data.

As described above, the memory device 150 in the memory system 110 may include one or more memory blocks 152, 154, 156. Each of the memory blocks 152, 154, 156 includes a plurality of non-volatile memory cells. According to an embodiment, the memory blocks 152, 154, 156 can be a group of non-volatile memory cells erased together. The memory blocks 152, 154, 156 may include a plurality of pages, which is a group of non-volatile memory cells read or programmed together.

In an embodiment, each of the memory blocks 152, 154, 156 may have a three-dimensional stack structure for high integration. Further, the memory device 150 may include a plurality of dies, each die including a plurality of planes, each plane including the memory blocks 152, 154, 156. A configuration of the memory device 150 may be changed depending on performance of the memory system 110.

In FIG. 2, the memory device 150 includes memory blocks 152, 154, and 156 which may be any of single-level cell (SLC) memory blocks, multi-level cell (MLC) memory blocks, or the like, based on the number of bits that can be stored in one memory cell. A SLC memory block includes a plurality of pages implemented by memory cells, each memory cell storing one bit of data. A SLC memory block may have higher data I/O operation performance and higher durability than the MLC memory block. A MLC memory block includes a plurality of pages implemented by memory cells, with each memory cell storing multi-bit data, e.g., two or more bits of data. The MLC memory block may have larger storage capacity for the same space compared to the SLC memory block. The MLC memory block can be highly integrated in view of storage capacity.

In an embodiment, the memory device 150 may be implemented with MLC memory blocks such as a double level cell (DLC) memory block, a triple-level cell (TLC) memory block, a quadruple-level cell (QLC) memory block, or a combination thereof. A DLC memory block may include a plurality of pages implemented by memory cells, with each memory cell capable of storing 2-bit data. A TLC memory block can include a plurality of pages implemented by memory cells, with each memory cell capable of storing 3-bit data. A QLC memory block can include a plurality of pages implemented by memory cells, with each memory cell capable of storing 4-bit data. In another embodiment, the memory device 150 can be implemented with a block including a plurality of pages implemented by memory cells, with each memory cell capable of storing five or more bits of data.

According to an embodiment, the controller 130 may use an MLC memory block included in the memory device 150 as an SLC memory block that stores one-bit data in one memory cell. A data input/output speed of the multi-level cell (MLC) memory block can be slower than that of the SLC memory block. For example, when the MLC memory block is used as the SLC memory block, the margin for a read or program operation can be reduced. For example, the controller 130 may perform a data input/output operation with a higher speed when the MLC memory block is used as the SLC memory block. Thus, the controller 130 may use the MLC memory block as a SLC buffer to temporarily store data because the buffer may use a high data input/output speed for improving performance of the memory system 110.

According to an embodiment, the controller 130 can program data in an MLC a plurality of times without performing an erase operation on a specific MLC memory block included in the memory device 150. In general, non-volatile memory cells do not support data overwrite. However, the controller 130 may program 1-bit data in the MLC a plurality of times using a feature in which the MLC is capable of storing multi-bit data. For an MLC overwrite operation, the controller 130 may store the number of program times as separate operation information when 1-bit data is programmed in an MLC. According to an embodiment, an operation for uniformly levelling threshold voltages of the MLCs may be carried out before another 1-bit data is programmed in the same MLCs, each having stored another-bit data.

In an embodiment, the memory device 150 is embodied as a non-volatile memory such as a flash memory, for example, as a NAND flash memory, a NOR flash memory, or the like. In another embodiment, the memory device 150 may be implemented by at least one of a phase change random access memory (PCRAM), a ferroelectrics random access memory (FRAM), a spin transfer torque random access memory (STT-RAM), a spin transfer torque magnetic random access memory (STT-MRAM), or the like.

Figure 3A:
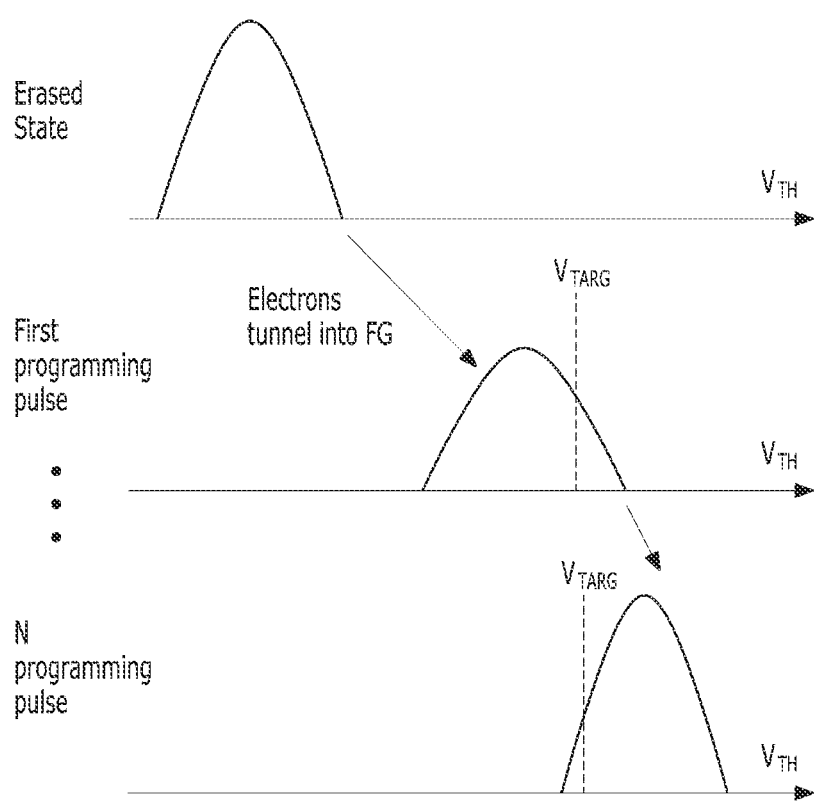
FIGS. 3A and 3B illustrate a first example of an Incremental Step Pulse Programming (ISPP) operation according to an embodiment of the present disclosure.
Figure 3B:
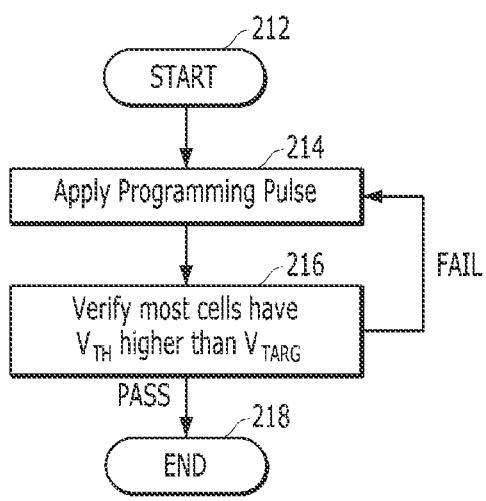

FIGS. 3A and 3B illustrate an Incremental Step Pulse Programming (ISPP) operation according to an embodiment of the present disclosure.

Referring to FIG. 3A, data may be programmed in a non-volatile memory cell that is in an erased state. When a programming pulse is supplied to a word line coupled to the non-volatile memory cell, the threshold voltage distribution of the non-volatile memory cell may shift from the erased state to the right, e.g., a direction in which the threshold voltage increases. If the programming pulse is continuously supplied to the non-volatile memory cell, the threshold voltage distribution of the non-volatile memory cell may continuously shift to the right. The programming pulse may be supplied until most (e.g., a predetermined number) of the plurality of non-volatile memory cells have a threshold voltage higher than the target voltage $V_{TARG}$ in a threshold voltage distribution.

In FIG. 3B, when a program operation starts (operation 212), the memory device 150 can apply a programming pulse to a plurality of non-volatile memory cells to be programmed with data (operation 214). After the programming pulse is applied, the memory device 150 can verify whether most (e.g., a predetermined number) of the plurality of non-volatile memory cells have a threshold voltage $V_{TH}$ higher than the target voltage $V_{TARG}$ (operation 216). When it is determined that most of the plurality of non-volatile memory cells do not have a threshold voltage $V_{TH}$ higher than the target voltage $V_{TARG}$ according to a verification result FAIL, the memory device 150 applies another programming pulse to the corresponding non-volatile memory cells (operation 214). When most of the plurality of non-volatile memory cells have a threshold voltage $V_{TH}$ higher than the target voltage $V_{TARG}$ according to another verification result PASS, the memory device 150 may end the program operation (operation 218).

In order to narrow the threshold voltage distribution of the plurality of non-volatile memory cells, it is advantageous to slightly shift (e.g., by a first amount) the threshold voltage distribution of the plurality of non-volatile memory cells to the right rather than greatly shifting them (e.g., by a second amount greater than the first amount) to the right when a single programming pulse is applied. On the other hand, when the threshold voltage distribution of the plurality of non-volatile memory cells is slightly shifted to the right, the number of times the programming pulse is applied may increase.

According to an embodiment, three times or more than the number of bits of data may be stored in the non-volatile memory cell. For example, when 2 bits of data can be stored in a non-volatile memory cell, the non-volatile memory cell may have four programmed states (e.g., '00', '01', '10', and '11') corresponding to 2-bit data. In order to form a tighter threshold voltage distribution (e.g., a narrower distribution, a degree to which the threshold voltage distribution of a plurality of non-volatile memory cells is shifted to the right, in response to a single programming pulse) can be smaller than a difference in two adjacent programmed states. For example, when two or more programming pulses are applied, it can be designed to move by a difference between two adjacent programmed states. In this case, the number of times of applying the programming pulse may be 8 times or more, which is more than 4 times than the number of bits of data.

According to an embodiment, the degree to which the threshold voltage distribution of the plurality of non-volatile memory cells moves when a single programming pulse is applied may be understood as a target level. An example of the target level is described in greater detail for the embodiment of FIG. 6.

Figure 4:
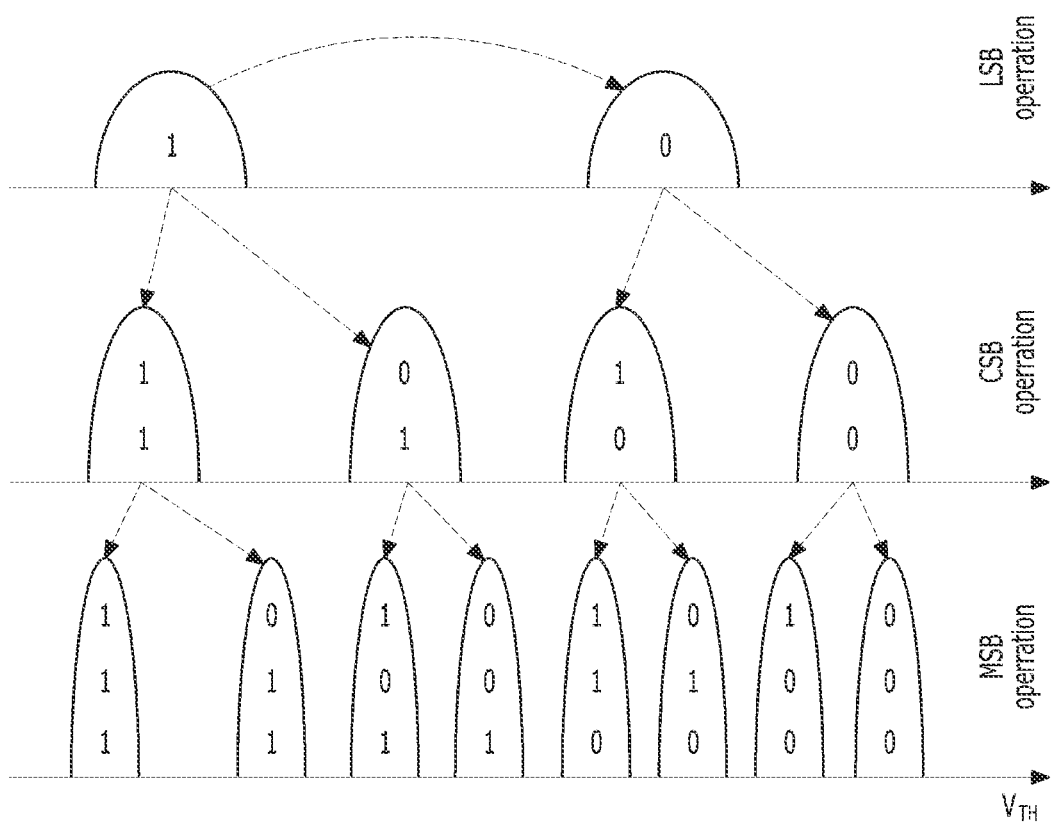
FIG. 4 illustrates a method for storing multi-bit data in a non-volatile memory cell according to an embodiment of the present disclosure.

FIG. 4 illustrates a method for storing multi-bit data in a non-volatile memory cell according to an embodiment of the present disclosure. The method of FIG. 4 may include a program operation performed in the memory device 150 including non-volatile memory cells, each capable of storing 3-bit data.

Data stored in the non-volatile memory cell may be distinguishable based on a level of threshold voltage $V_{TH}$ of the corresponding memory cell. The threshold voltage $V_{TH}$ of the memory cell can vary depending on the quantity of electrons or charges injected into a floating gate of the corresponding memory cell. A single-level cell SLC may be divided into two ranges of the threshold voltage VTH, to store 1-bit data of "0" or "1". A triple-level cell TLC in the memory device 150 may have eight threshold voltage ranges.

Referring to FIG. 4, in order to reduce the number of applications of programming pulses in an incremental step pulse programming (ISPP) operation, the application of program pulses applied to the triple level cell TLC in response to bits of data stored in the triple level cell TLC can be controlled differently. Data stored in the triple-level cell TLC can be divided into LSB data, CSB data, and MSB data. In a process of programming the LSB data, the number of times of applying the programming pulses may be the smallest, and the number of times of applying the programming pulses in a process of programming the CSB data may be greater than that of programming the LSB data. In a process of programming the MSB data, the number of times of applying the programming pulses can be the largest.

In a memory device including a triple-level cell (TLC), each physical page may be divided into three logical pages that are an LSB page, a CSB page, and an MSB page. A programming pulse applied to each page can be different. For example, shifts of different positive threshold voltage ($V_{TH}$) distributions may be induced in processes of programming the LSB, CSB, and MSB data. In an embodiment, the threshold voltages $V_{TH}$ of the plurality of non-volatile memory cells can move the most in the process of programming the LSB page, and the threshold voltages $V_{TH}$ of the plurality of non-volatile memory cells can move the least in a process of programming the MSB page. According to an embodiment, when the number of times a programming pulse is applied in the process of programming the LSB page is the least, delay time can be the shortest and power consumption can also be the smallest. On the other hand, in the process of programming the MSB page, the number of times that the programming pulse is applied may increase so that the delay time and the power consumption can be increased.

Figure 5:
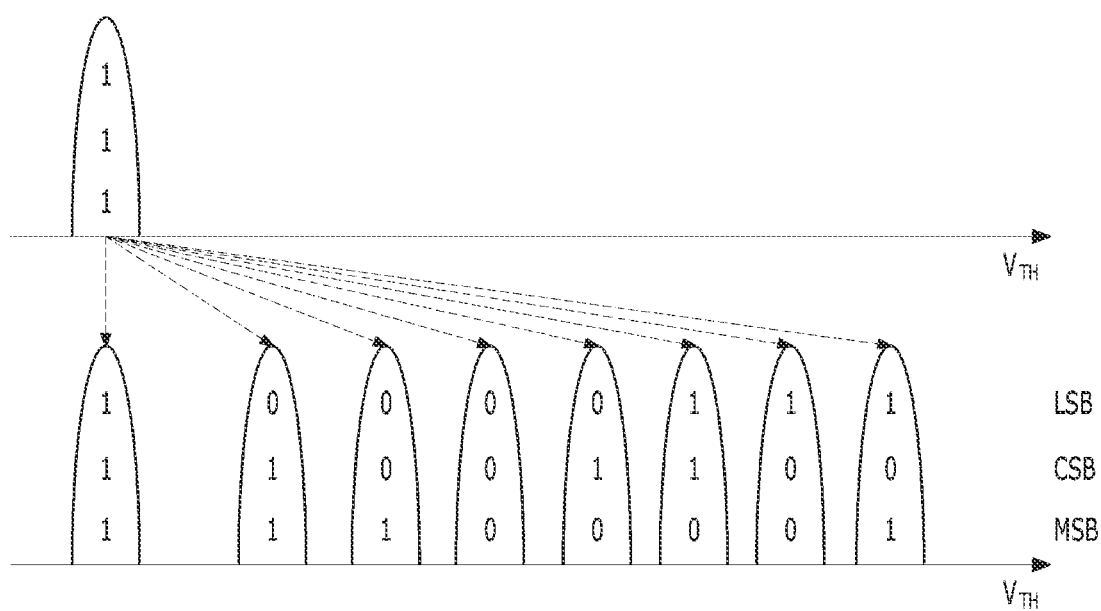
FIG. 5 illustrates another method for storing multi-bit data in a non-volatile memory cell according to an embodiment of the present disclosure.

FIG. 5 illustrates another method for storing multi-bit data in a non-volatile memory cell according to an embodiment of the present disclosure. In FIG. 5, a program operation performed by the memory device 150 including a non-volatile memory cell capable of storing 3-bit data will be described as an example.

Referring to FIG. 5, the memory device 150 may not sequentially divide the operation of storing 3-bit data in the non-volatile memory cell into LSB, CSB, and MSB program operations. In order to store the 3-bit data in the non-volatile memory cell without separation, code values for LSB, CSB, and MSB corresponding to eight program states can be different from those shown in FIG. 4. The 3-bit data corresponding to 8 program states can be determined as gray codes, and the code values for LSB, CSB, and MSB can be differently set. Herein, a gray code may be a code made to change the value of only one bit (1 bit) between adjacent data when data is changed. For example, it may be understood that data in the erase state is '111' and data in the lowest program state is '011'. Data of the second lowest program state adjacent to data '011' of the lowest program state may be '001'.

Referring to FIGS. 4 and 5, code values of LSB, CSB, and MSB may be different according to how to store multi-bit data in a non-volatile memory cell. For example, the code value corresponding to the MSB of eight program states shown in FIG. 4 may be '10101010', while the code value of the MSB of eight program states shown in FIG. 5 may be '11100001'. According to an embodiment, the code values for the LSB and the MSB described in FIGS. 4 and 5 can be different according to an embodiment.

Figure 6:
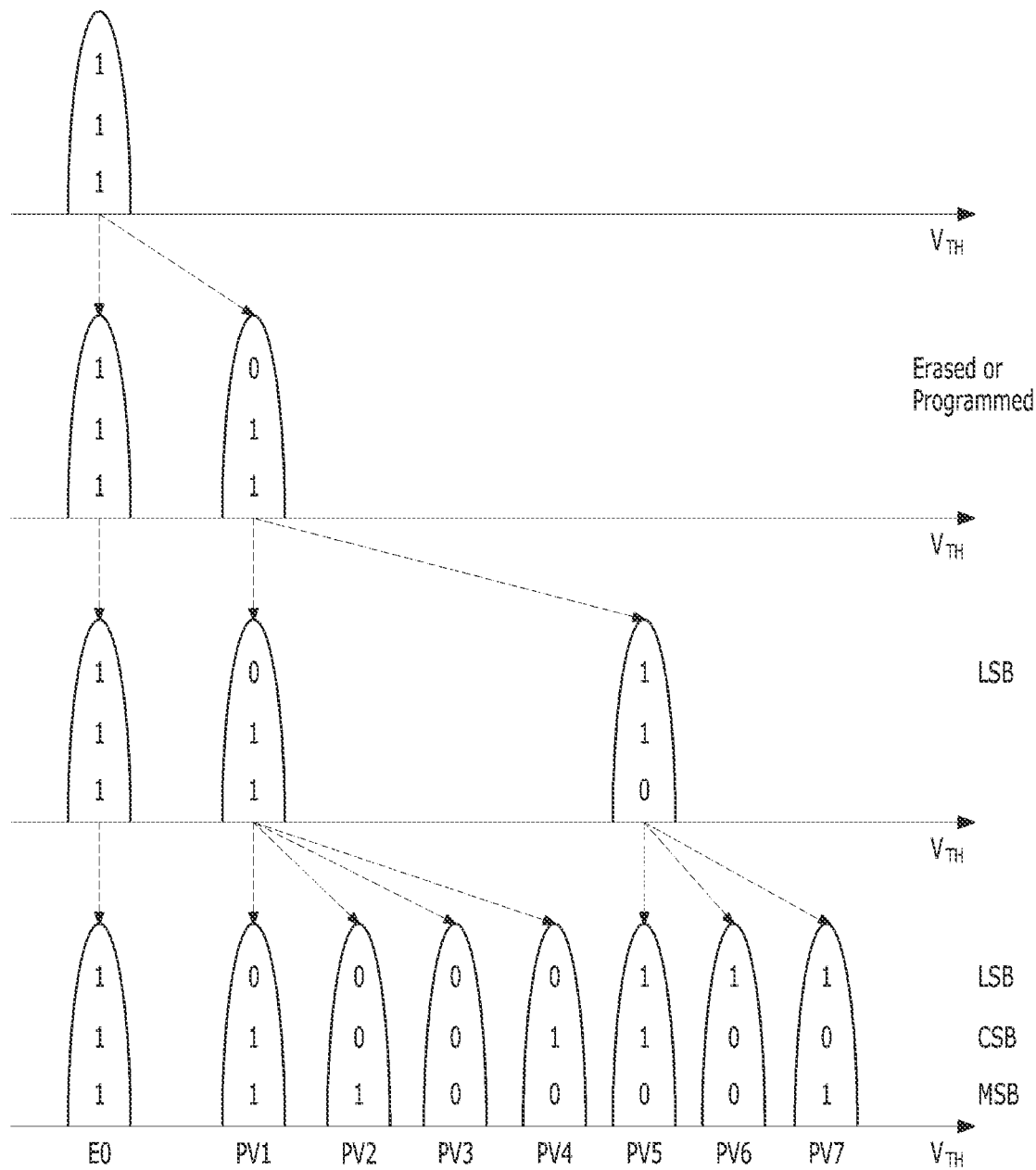
FIG. 6 illustrates another method for storing multi-bit data in a non-volatile memory cell according to an embodiment of the present disclosure.

FIG. 6 illustrates another method for storing multi-bit data in a non-volatile memory cell according to an embodiment of the present disclosure. In FIG. 6, a program performed in the memory device 150 including a non-volatile memory cell capable of storing 3-bit data will be described as an example.

Referring to FIG. 6, the memory device 150 may perform a data program operation for storing 3-bit data in the non-volatile memory cell in three stages. The data program operation could be divided into three step operations. First, plural non-volatile memory calls included in the memory device 150 can be split into two groups: one group is kept in an erase state (e.g., corresponding to data '111', E0) in which LSB, CSB, and MSB are all '1' after the data program operation; and the other group is in any one of programmed states PV1 to PV7. Herein, the other group including memory cells to be programmed by a program pulse may include a memory cell corresponding to a 3-bit data in which '0' is included in at least one of LSB, CSB, and MSB, e.g., other 3-bit data except for the data '111'.

According to an embodiment, an operation for dividing the non-volatile memory cells into the two groups of the erased state E0 and the programmed states PV1 to PV7 during a first step program operation can be used as a method for checking an operating state of the non-volatile memory cells. For example, when a defect occurs in a specific non-volatile memory cell, a threshold voltage VTH thereof does not change in many cases even when a program pulse is applied to the non-volatile memory cell. During the first step program operation, a pulse can be commonly applied to plural non-volatile memory cells to be programmed with the programmed states PV1 to PV7 corresponding to seven 3-bit data including '0' in at least one of LSB, CSB, and MSB among a plurality of non-volatile memory cells. This may be performed in order to shift or move a threshold voltage VTH thereof from the erased state (e.g., corresponding to data '111', E0) to a closest programmed state (e.g., corresponding to data '011', PV1). If there is no change or shift (e.g., from the erased state E0 corresponding to data '111' to the closest programmed state PV1 corresponding to data '011') on a threshold voltage of a specific non-volatile memory cell that will have one of the programmed states PV1 to PV7 after the pulse is commonly applied thereto, data reliability stored in the corresponding non-volatile memory cell could be secured or guaranteed. Whether or not the non-volatile memory cell is defective could be determined through the commonly applied program pulse. According to an embodiment, if it is determined that some of program-targeted non-volatile memory cells has a defect, the memory device 150 or the memory system 110 can change a physical address assigned to the 3-bit data (e.g., the location to store the 3-bit data could be changed to another page or another memory block included in the memory device 150).

After the first step program operation for programming plural non-volatile memory cells (which will have one of programmed states corresponding to the seven 3-bit data, from the erased state E0 corresponding to data '111' to the closest program state PV1 corresponding to data '011'), the LSB data can be programmed into the plural non-volatile memory cells. The programmed states PV1 to PV7 corresponding to the seven 3-bit data can be divided into two program groups based on the LSB data. The LSB data is '0' in the non-volatile memory cells included in a first program group from the first program state PV1 to the fourth program state PV4 among the first program state PV1 to the seventh program state PV7. On the other hand, the LSB data is '1' in the nonvolatile memory cell included in a second program group from the fifth program state PV5 to the seventh program state PV7 among the first program state PV1 to the seventh program state PV7. Accordingly, during a second step program operation to program the LSB data, a program pulse is selectively applied to the non-volatile memory cells, included in the second program group from the fifth program state PV5 to the seventh program state PV7, to shift or change the threshold voltage distribution from the first program state PV1 to the fifth program state PV5.

Thereafter, the memory device 150 may program 2-bit data corresponding to the CSB and the MSB in the non-volatile memory cell. For example, the memory device 150 can selectively apply a program pulse to the non-volatile memory cell having the first program state PV1 so as to shift or change a threshold voltage VTH of the non-volatile memory cell. The threshold voltage VTH thereof can belong to one of threshold voltage distributions corresponding to the first program state PV1 to the fourth program state PV4. In addition, the memory device 150 can selectively apply a program pulse to the nonvolatile memory cell having the fifth program state PV5, in order to shift or change a threshold voltage VTH of the non-volatile memory cell. The threshold voltage VTH thereof can belong to one of the threshold voltage distributions corresponding to the fifth program state PV5 to the seventh program state PV7.

Figure 7:
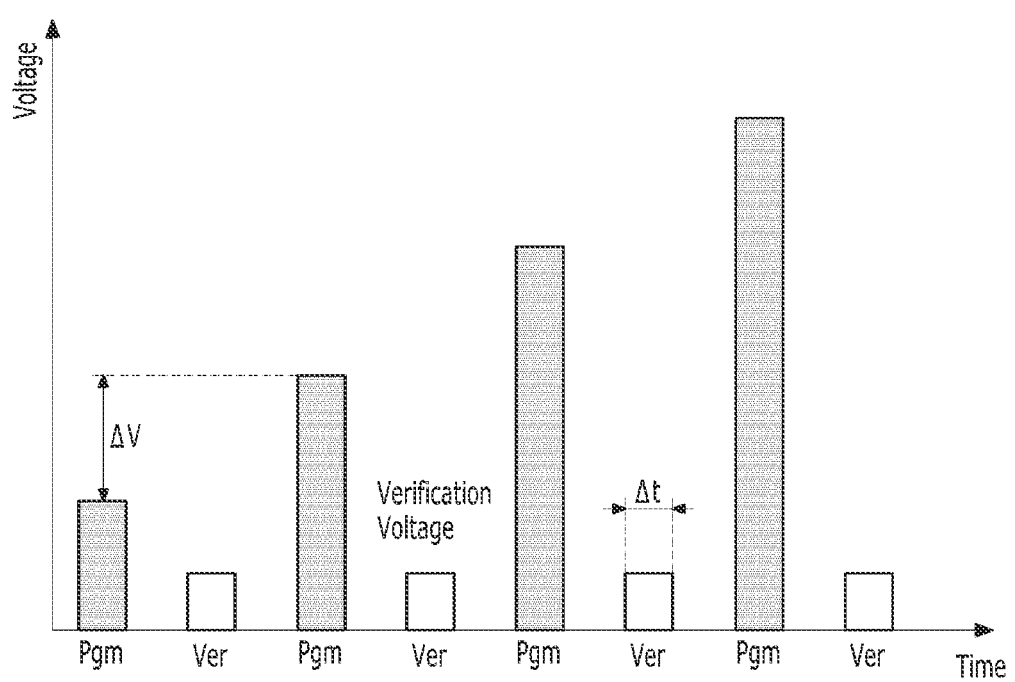
FIG. 7 illustrates a program operation and a verification operation of the Incremental Step Pulse Programming (ISPP) operation according to an embodiment of the present disclosure.

FIG. 7 illustrates a program voltage application operation and a verification operation of the ISPP operation according to an embodiment of the present disclosure.

Referring to FIG. 7, after the program voltage application operation Pgm is performed during the ISPP operation, the memory device 150 performs a verification operation Ver corresponding to the program voltage application operation Pgm. Each program voltage application operation Pgm can increase the threshold voltage $V_{TH}$ of the non-volatile memory cell. For example, each program voltage application operation Pgm increases the threshold voltage $V_{TH}$ of the non-volatile memory cell by the first potential difference $\Delta V$.

After the program voltage application operation Pgm is performed, the threshold voltage $V_{TH}$ of the non-volatile memory cell may be compared with a verification voltage in the verification operation. When the threshold voltage $V_{TH}$ of the non-volatile memory cell is lower than the verification voltage, the next program voltage application operation Pgm may be performed again to add more electrons into the floating gate of the non-volatile memory cell. Thereafter, the verification operation Ver is performed in response to the corresponding program voltage application operation Pgm. The repeated program voltage application operation Pgm may be performed until the threshold voltage $V_{TH}$ of the non-volatile memory cell becomes a verification voltage or higher.

According to an embodiment, the number of repetitions of the program voltage application operation Pgm and the verification operation Ver may vary depending on a standby time or delay time, power consumption, accuracy, and the like. When the threshold voltage $V_{TH}$ of the non-volatile memory cell is finely increased through the program voltage application operation Pgm, accuracy of the program voltage application operation can be increased. However, delay time and power consumption can be longer and greater as a greater number of program voltage application operations can be performed. On the other hand, when the threshold voltage $V_{TH}$ of the non-volatile memory cell is greatly increased through each program voltage application operation Pgm, power consumption and operation time of the program voltage application operation Pgm may be increased and shorter. The operation times $\Delta t$ of the program voltage application operation Pgm and the verify operation Ver may vary according to the goal of each program voltage application operation Pgm, e.g., a change of the threshold voltage $V_{TH}$.

Referring to FIGS. 4 to 6, in a memory device including a triple-level non-volatile memory cell TLC, the program voltage application operation Pgm and the verify operation Ver may be differently performed based on purpose and procedure of programming data in the least significant bit LSB, the center significant bit CSB and the most significant bit MSB of the memory cell. In FIG. 4, a memory device including a triple level non-volatile memory cell TLC has been described as an example, but the above-described program operation can also be applied to a memory device including a quadruple level non-volatile memory cell (QLC) for storing 4-bit data or a non-volatile memory cell capable of storing 5 or more bit data.

According to an embodiment, for each program loop during the ISPP operation, the voltage level of the program pulse applied to the non-volatile memory cell in the program voltage application operation Pgm may be gradually increased by a preset voltage $\Delta V$. However, the voltage level of the verification pulse applied to the non-volatile memory cell in the verification operation Ver corresponding to the program voltage application operation Pgm may be substantially the same, e.g., not changed. In the verification operation Ver for each program loop, substantially the same verification pulse is applied to the non-volatile memory cell, but the time $\Delta t$ for applying the verification pulse may vary. When the verification operation is performed by reflecting noise generated according to operating characteristics of the memory device 150, the memory device 150 may change or adjust the voltage level of the verification pulse.

Figure 8:
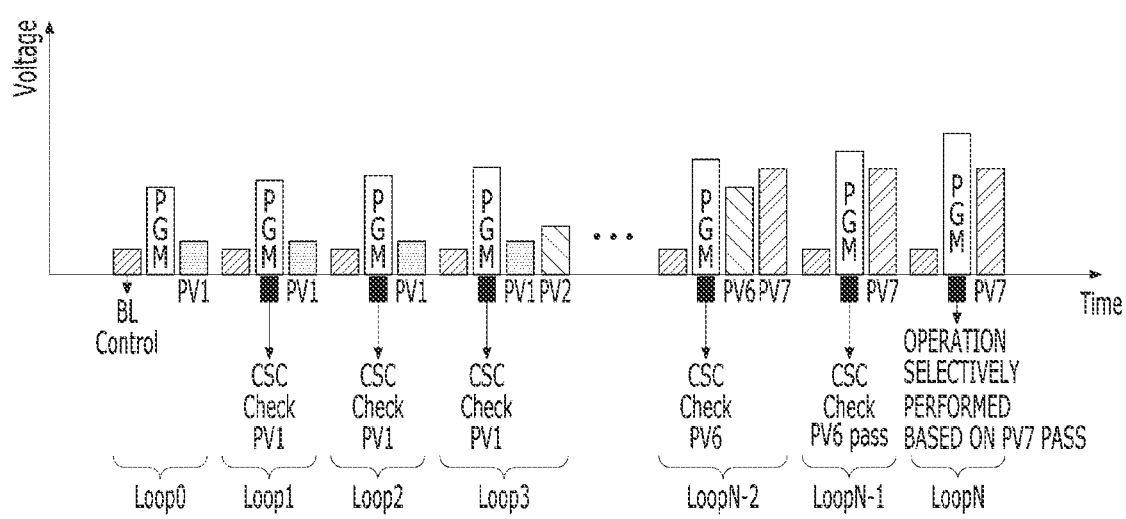
FIG. 8 illustrates a second example of an Incremental Step Pulse Programming (ISPP) operation according to an embodiment of the present disclosure.

FIG. 8 illustrates a second example of an Incremental Step Pulse Programming (ISPP) operation according to an embodiment of the present disclosure.

Referring to FIG. 8, the memory device 150 can perform plural program loops Loop0 to LoopN to program data in a non-volatile memory cell. At least some program loops can be repeatedly performed. Each of the plural program loops Loop0 to LoopN can include controlling a bit line (BL Control) before applying a program pulse PGM to the non-volatile memory cell and performing a verification operation after applying the program pulse PGM to the non-volatile memory cell.

Referring to FIGS. 4 to 7, the level of the program pulse PGM applied to non-volatile memory cells may vary in response to data programmed into the non-volatile memory cells. The memory device 150 may sequentially apply program pulses corresponding to the first program state PV1 to the seventh program state PV7 to the non-volatile memory cells. For example, different program pulses corresponding to the first program state PV1 to the seventh program state PV7 may be sequentially applied to the non-volatile memory cells during a data program operation. After it is determined through a verification operation for a specific program state that a program operation for the corresponding program state (applying a program pulse corresponding to the program state to the non-volatile memory cells) has succeeded, a program operation for the next program state can be performed to the non-volatile memory cells.

Referring to FIGS. 4 to 6 and 8, the memory device 150 can sequentially apply program pulses PGM to plural non-volatile memory cells. The program pulses PGM sequentially applied can correspond to 7 program states (e.g., the first program state PV1 to the seventh program state PV7). The plural non-volatile memory cells may be selectively programmed through a bit line control. When the memory device 150 sequentially applies the program pulses PGM in response to a target program state of the plural non-volatile memory cells, whether to perform a program loop with a specific program pulse may be determined based on whether a memory cell to be programmed into a program state corresponding to the specific program pulse exists among the plural non-volatile memory cells.

Plural non-volatile memory cells are included in the cell array 330 or the memory blocks 152, 154, 156 of the memory device 150. As a degree of integration increases, the distance or interval between neighboring non-volatile memory cells becomes closer. Accordingly, a program disturb may be more likely to occur during a data program operation. For example, when the program pulses PGM corresponding to the first program state PV1 to the seventh program state PV7 are sequentially applied to non-volatile memory cells, at least some of the non-volatile memory cells could be repeatedly stressed by the program pulses PGM sequentially applied. Such a data program operation may deteriorate durability of the non-volatile memory cells and cause a defect.

Figure 9:
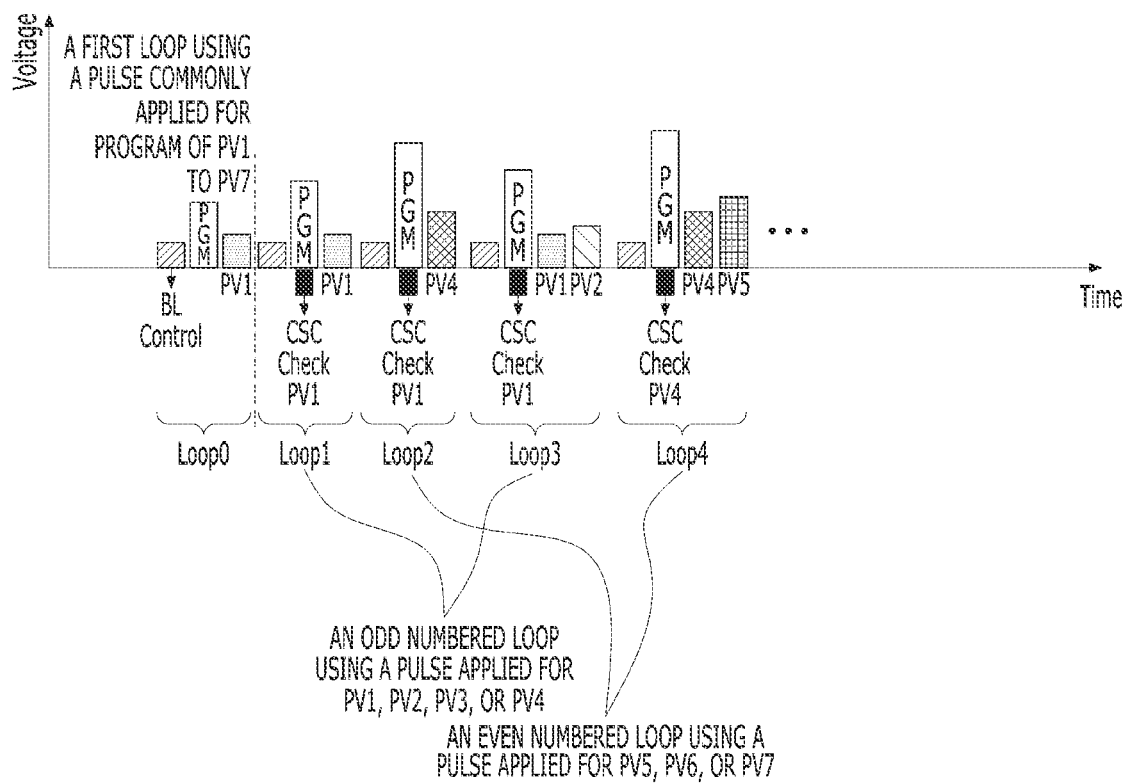
FIG. 9 illustrates a third example of an Incremental Step Pulse Programming (ISPP) operation according to an embodiment of the present disclosure.

FIG. 9 illustrates a third example of an Incremental Step Pulse Programming (ISPP) operation according to an embodiment of the present disclosure.

Referring to FIG. 9, the memory device 150 may repeat a plurality of program loops Loop0 to Loop4 to program multi-bit data in a non-volatile memory cell. Each of the program loops Loop0 to Loop4 may include controlling a bit line (BL Control) before applying the program pulse PGM and performing a verification operation after applying the program pulse PGM.

Referring to FIGS. 6 and 9, the memory device 150 can split plural non-volatile memory cells into two cell groups. A first cell group includes a memory cell to be programmed with one of a first program state PV1 to a seventh program state PV7 among the plural non-volatile memory cells. A second cell group includes a non-volatile memory cell maintained in an erase state E0 after the program pulse PGM is applied. The memory device 150 may apply a common program pulse to the first cell group including a non-volatile memory cell to be programmed with one of the first program state PV1 to the seventh program state PV7 to perform a zeroth program loop Loop0 of the plurality of program loops Loop0 to Loop4. According to an embodiment, the zeroth program loop Loop0 may include a verification operation for the first program state PV1 performed after the application of the program pulse PGM.

According to an embodiment, the memory device 150 may classify the plurality of program loops Loop1 to Loop4 into a plurality of groups. For example, the plurality of program loops Loop1 to Loop4 may be divided into two program groups. For example, odd-numbered program loops Loop1, Loop3 may belong to a first program group, and even-numbered program loops Loop2, Loop4 may belong to a second program group. The memory device 150 may use the first program group to program first non-volatile memory cells, each memory cell to be programmed with one of the first to fourth program states PV1 to PV4, and the second program group to program second non-volatile memory cells, each memory cell to be programmed with one of the fifth to seventh program states PV5 to PV7. In the first program group including the odd-numbered program loops Loop1, Loop3, the memory device 150 can apply program pulses PGM corresponding to the first to fourth program states PV1 to PV4 to the first non-volatile memory cells. In the second program group including the even-numbered program loops Loop2, Loop4, the memory device can apply program pulses PGM corresponding the fifth to seventh program states PV5 to PV7 to the second non-volatile memory cells. The program pulses PGM applied in the first program group can be different from that applied in the second program group, because targeted program states of the first and second program groups are different from each other.

Referring to FIGS. 4 and 9, the plural non-volatile memory cells may be divided into two cell groups based on LSB data stored in the plural non-volatile memory cells. In this embodiment, the memory device 150 may divide a plurality of repeated program loops into two program groups and use each program group to program multi-bit data in each of the two cell groups divided based on the LSB data.

Although it is shown in FIG. 9 that the plurality of program loops are divided into two groups, the plurality of program loops may be divided into a different number of groups (e.g., four groups or more) according to an embodiment. When the number of bits of data programmed in the non-volatile memory cell of the memory device 150 is 4 bits or more, the plurality of program loops may be divided into four groups or more. Also, referring to FIGS. 4 and 6, when an operation of applying a program pulse to a non-volatile memory cell storing multi-bit data can be divided into a plurality of step program operations, the memory device 150 can divide program loops included in each step program operation into a plurality of step program groups. In each step program group, the memory device 150 can apply different program pulses PGM corresponding to different program states to the cell array 330 or the memory blocks 152, 154, 156.

During a data program operation, a program disturb may occur due to a significant difference between threshold voltages VTH of non-volatile memory cells maintained in the erase state E0 and programmed with high-level program states (e.g., the sixth and seventh program states P6, P7 which are one of program states furthest from the erase state E0) when the program pulse PGM might be sequentially applied to the cell array 330 or the memory blocks 152, 154, 156. In an embodiment, the plural program loops can be divided into plural program groups, in order to prevent program pulses (used for the high-level program states) from being sequentially applied to the cell array 330 or the memory blocks 152, 154, 156. For example, the memory device 150 can apply a low-potential (or short-time) program pulse PGM to the plural non-volatile memory cells for shifting or forming a low-level threshold voltage (VTH) distribution during an odd-numbered program loop, as well as apply a high-potential (or long-time) program pulse PGM to the plural non-volatile memory cells for shifting or forming a high-level threshold voltage (VTH) distribution during an even-numbered program loop. According to another embodiment, the memory device 150 may apply the high-potential (or long-time) program pulse PGM during the odd-numbered program loop and the low-potential (or short-time) program pulse PGM during the even-numbered program loop, alternatively. When programming with the high-level program states, a non-volatile memory cell included in the cell array 330 or the memory blocks 152, 154, 156, the memory device 150 can reduce stress applied to neighboring non-volatile memory cells surrounding the corresponding non-volatile memory cell.

Figure 10:
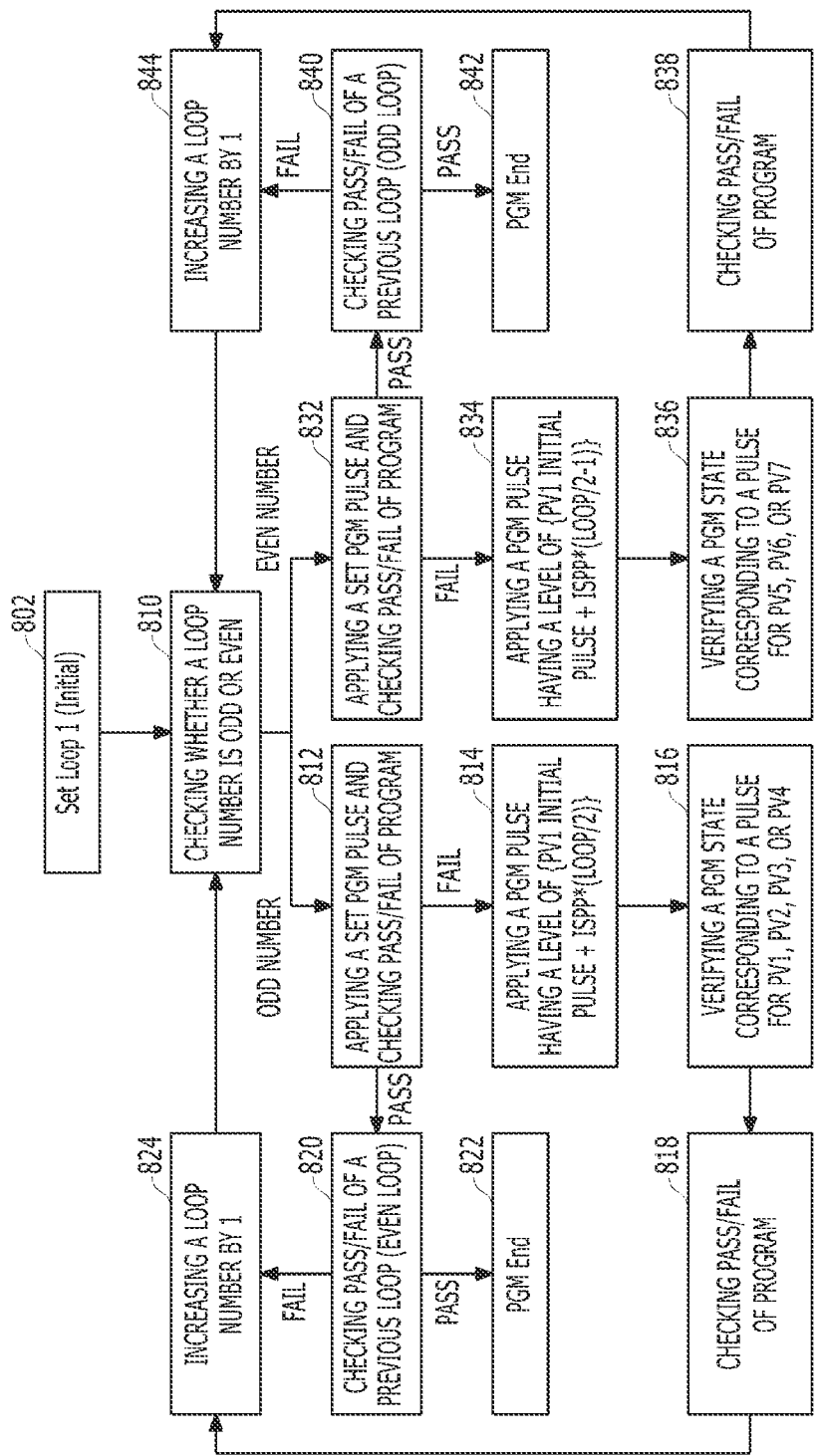
FIG. 10 illustrates a first example of a program operation according to an embodiment of the present disclosure.

FIG. 10 illustrates a first example of a program operation according to an embodiment of the present disclosure.

Referring to FIG. 10, a data program operation performed by the memory device 150 can include setting a number of program loop as an odd number of '1' (operation 802).

The memory device 150 may check the number of the program loop to determine whether it is an even number or an odd number (operation 810). If the number of the program loop is an odd number, a program pulse set for the odd-numbered program loop may be applied. Then, the memory device 150 can check and determine whether a program operation according to the applied program pulse passes or fails (operation 812).

After a threshold voltage distribution of the memory cells moves or shifts, as expected, in response to an applied program pulse (PASS in the operation 812), the memory device 150 can check whether a result of a previous program loop (e.g., even-numbered program loop) has succeeded or failed (operation 820). If the result of the previous program loop has succeeded (PASS in the operation 820), the memory device 150 may terminate the data program operation (operation 822). According to an embodiment, the memory device 150 may include a storage space (e.g., a register, etc.) for recording results (e.g., success/failure) of at least two program loops. If the result of the previous program loop has failed (FAIL in the operation 820), the memory device 150 can increase the number of the program loop by 1 (operation 824). The memory device 150 checks the value of the program loop increased by 1 (e.g., an even number "2" because it is increased by 1 from the odd number of "1"), the memory device 150 can apply a program pulse set for the even-numbered program loop, and check whether a program operation according to the applied program pulse passes or fails (operation 832).

In response to the program pulse applied in the odd-numbered program loop, if the threshold voltage distribution of the memory cells does not move or shift as expected (FAIL in the operation 812), the memory device 150 may re-apply the program pulse (operation 814). According to an embodiment, the level of the program pulse is determined by multiplying the increment (ISPP), which is increased for each program loop, by a quotient obtained by dividing the number of the program loop by 2, and then adding a multiplied value into a level of the program pulse applied for the first program state (PV1) (e.g., PV1 Initial Pulse+ISPP× (Loop/2)). The memory device 150 may verify program states (e.g., one of first to fourth program states PV1 to PV4) corresponding to the applied program pulse (operation 816). The memory device 150 may determine whether a program operation regarding a target program state corresponding to the applied program pulse has succeeded or failed and store a result in the storage space (operation 818). Thereafter, the memory device 150 may increase the number of the program loop by 1 (operation 824).

If the memory device 150 recognizes that the number of the program loop is an even number, the memory device 150 may apply a program pulse set for the even-numbered program loop and check whether a program operation succeeds or fails (operation 832). If the threshold voltage distribution of the memory cells moves or shifts, as expected, in response to the applied program pulse (PASS in the operation 832), the memory device 150 can check whether the result of the previous program loop (e.g., an odd-numbered program loop) has succeeded or failed (operation 840). If the result of the previous program loop has succeeded (PASS of the operation 840), the memory device 150 may terminate the data program operation (operation 842). If the result of the previous program loop is a failure (FAIL in the operation 840), the memory device 150 can increase the number of the program loop by 1 (operation 844). The memory device 150 checks the number of the program loop increased by 1 (e.g., an odd number "3" because it increased by 1 from the previous even number of "2"), the memory device 150 can apply a program pulse set for the odd-numbered program loop to the memory cells, and check whether a program operation according to the applied program pulse passes or fails (operation 812).

In response to the program pulse applied in the even-numbered program loop, if the threshold voltage distribution of the memory cells does not move or shift as expected (FAIL in the operation 832), the memory device 150 may re-apply the program pulse (operation 834). According to an embodiment, the level of the program pulse is obtained by multiplying the increment (ISPP), which is increased for each program loop, by subtracting 1 from the quotient obtained by dividing the number of the program loop by 2, and then adding a subtracted value into the level of the program pulse applied for the first program state PV1 (e.g., PV1 Initial Pulse+ISPP*(Loop/2−1)). The memory device 150 may verify a program state (e.g., one of the fifth to seventh program states PV5 to PV7) corresponding to the applied program pulse (operation 836). The memory device 150 may determine whether a program operation regarding a target program state corresponding to the applied program pulse has succeeded or failed (operation 838). Thereafter, the memory device 150 may increase the number of the program loop by 1 (operation 844).

Referring to FIG. 10, the memory device 150 can divide plural program loops into two groups (e.g., an odd-numbered program loop and an even-numbered program loop), apply a different program pulse corresponding to each group, and perform a verification operation corresponding to the applied program pulse. In addition, to determine whether the data program operation terminates, the memory device 150 may check whether the previously executed even-numbered program loop succeeds if the odd-numbered program loop succeeds, or whether the previously executed odd-numbered program loop succeeds if the even-numbered program loop succeeds.

Figure 11:
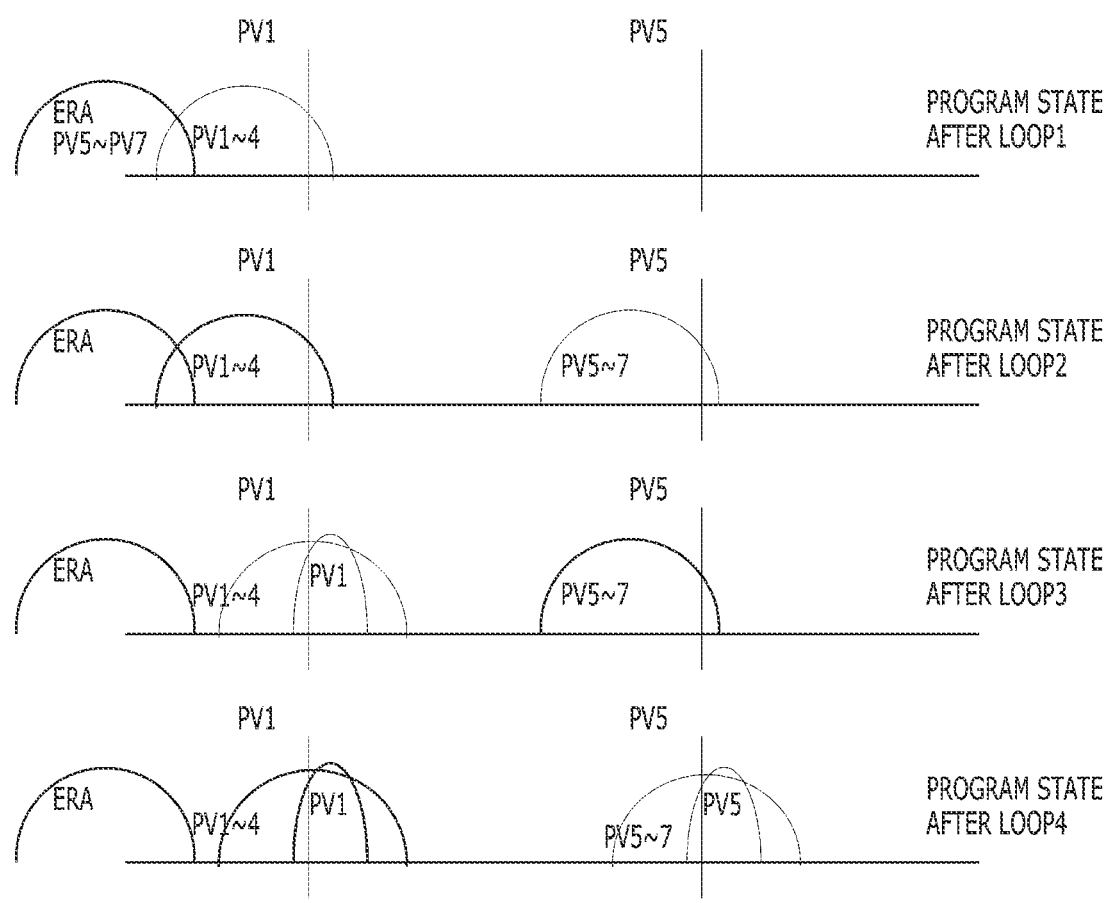
FIG. 11 illustrates cell threshold voltage distributions changed during the program operation shown in FIG. 10.

FIG. 11 illustrates cell threshold voltage distributions changed during the program operation shown in FIG. 10.

Referring to FIGS. 10 and 11, a first program loop is an odd-numbered program loop. When the first program loop is performed, threshold voltage distributions of the memory cells to be programmed with the first to fourth program states PV1 to PV4 are shifted in a right direction from the erase state ERA. On the other hand, after the first program loop has been performed, other threshold voltage distributions of the memory cells to be programmed with one of the fifth to seventh program states PV5 to PV7 may be maintained in the erase state ERA.

The second program loop is the even-numbered program loop. When the second program loop is performed, there is no change in the threshold voltage distribution of the memory cells to be programmed with one of the first to fourth program states PV1 to PV4, but other threshold voltage distribution of the memory cells to be programmed with one of the fifth to seventh program states PV5 to PV7 can be shifted in the right direction from the erase state ERA to approach the fifth program state PV5.

The third program loop is the odd-numbered program loop. When the third program loop is performed, a program pulse may be applied to some memory cells to be programmed with the first program state PV1 among the memory cells to be programmed with one of the first to fourth program states PV1 to PV4. Accordingly, a threshold voltage distribution corresponding to the first program state PV1 may be generated and shifted. On the other hand, no change may occur in threshold voltage distributions regarding other memory cells to be programmed with one of the second to fourth program states PV2 to PV4. Also, threshold voltage distributions regarding other memory cells to be programmed with one of the fifth to seventh program states PV5 to PV7 might not be changed in a current state approaching the fifth program state PV5.

The fourth program loop is the even-numbered program loop. When the fourth program loop is performed, there is no change in the threshold voltage distribution of the memory cells to be programmed with one of the first to fourth program states PV1 to PV4, but a program pulse may be applied to some memory cells to be programmed into the fifth program state PV5 among the memory cells to be programmed with one of the fifth to seventh program states PV5 to PV7, which have been shifted in the right direction from the erase state ERA. Accordingly, a threshold voltage distribution corresponding to the fifth program state PV5 may be generated. On the other hand, no change may occur in other threshold voltage distributions regarding other memory cells to be programmed with one of the sixth to seventh program states PV6 to PV7.

Referring to FIGS. 10 and 11, for a program operation, the memory device 150 may apply different program pulses to the memory cells according to an odd-numbered program loop and an even-numbered program loop. According to an embodiment, a coarse program operation (Coarse PGM) and a fine program operation (Fine PGM) may be alternately performed in each of the odd-numbered program loop and the even-numbered program loop. The width of the threshold voltage distribution generated through the fine program operation (Fine PGM) may be narrower than the width of the threshold voltage distribution generated through the coarse program operation (Coarse PGM), even though the fine program operation (Fine PGM) and the coarse program operation (Coarse PGM) are performed for programming the same data. For example, a coarse program operation (Coarse PGM) can be performed to move or shift threshold voltage distributions to approach different program states, and a fine program operation (Fine PGM) may be performed to narrow widths of the threshold voltage distributions after the coarse program operation (Coarse PGM) is performed.

Figure 12:
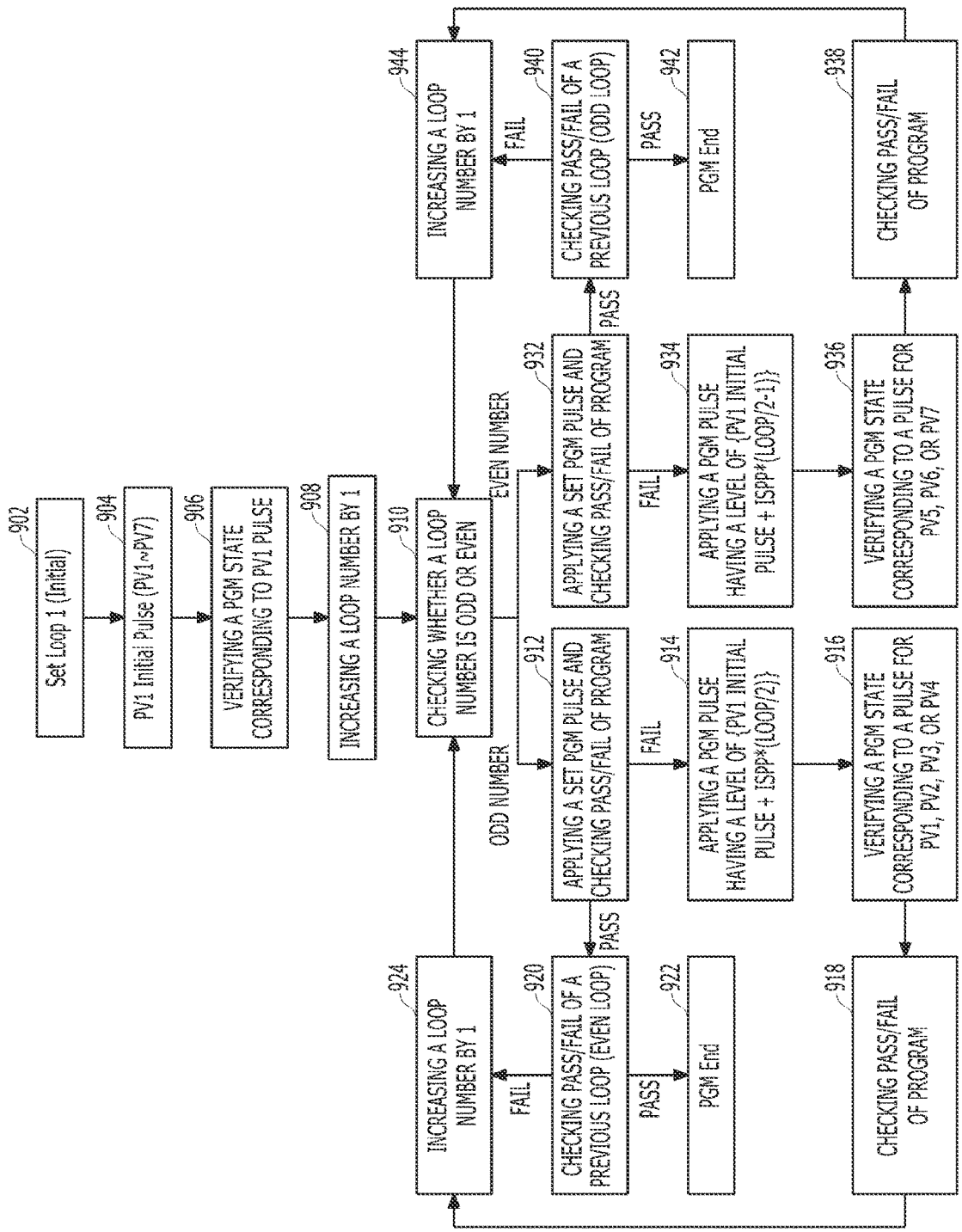
FIG. 12 illustrates a second example of a program operation according to an embodiment of the present disclosure.

FIG. 12 illustrates a second example of a program operation according to an embodiment of the present disclosure.

Referring to FIG. 12, a data program operation performed by the memory device 150 can include setting the number of the program loop as an odd number of '1' (operation 902). The memory device 150 can apply a program pulse corresponding to the first program state PV1 to some memory cells to be programmed with one of plural program states (e.g., PV1 to PV7) except for other memory cells maintained in an erase state after the data program operation among a plurality of non-volatile memory cells (operation 912). Herein, the plural program states may vary according to the number of bits of data that can be stored in each non-volatile memory cell. For example, referring to FIGS. 4 to 6, 3-bit data may be stored in a non-volatile memory cell. In these cases, the plural program states may include a first program state PV1 to a seventh program state PV7. Here, the first program state PV1 may correspond to a threshold voltage distribution closest to the erase state E0 among the plural program states (e.g., PV1 to PV7). After applying the program pulse corresponding to the first program state PV1 to some memory cells (operation 904), the memory device 150 may perform a verification operation corresponding to the applied program pulse (operation 906). Thereafter, the memory device 150 may increase the number of the program loop by 1 (operation 908).

The memory device 150 may check the number of the program loop to determine whether it is an even number or an odd number (operation 910). If the memory device 150 recognizes that the number of the program loop (e.g., 2, 4, 6, or etc.) is an even number, the memory device 150 may apply a program pulse set for the even-numbered program loop and check whether a program operation succeeds or fails (operation 932). If the threshold voltage distribution of the memory cells moves or shifts, as expected, in response to the applied program pulse (PASS in the operation 932), the memory device 150 can check whether the result of the previous program loop (e.g., an odd-numbered program loop) has succeeded or failed (operation 940). If the result of the previous program loop has succeeded (PASS of the operation 940), the memory device 150 may terminate the data program operation (operation 942). If the result of the previous program loop is a failure (FAIL in the operation 940), the memory device 150 can increase the number of the program loop by 1 (operation 944). The memory device 150 checks the number of the program loop increased by 1 (e.g., an odd number "3" because it increased by 1 from the previous even number of "2"), the memory device 150 can apply a program pulse set for the odd-numbered program loop to the memory cells, and check whether a program operation according to the applied program pulse passes or fails (operation 912).

In response to the program pulse applied in the even-numbered program loop, if the threshold voltage distribution of the memory cells does not move or shift as expected (FAIL in the operation 932), the memory device 150 may re-apply the program pulse (operation 934). The memory device 150 may verify a program state (e.g., one of the fifth to seventh program states PV5 to PV7) corresponding to the applied program pulse (operation 936). The memory device 150 may determine whether a program operation regarding a target program state corresponding to the applied program pulse has succeeded or failed (operation 938). Thereafter, the memory device 150 may increase the number of the program loop by 1 (operation 944).

If the number of the program loop (e.g., 3, 5, 7, or etc.) is an odd number, a program pulse set for the odd-numbered program loop may be applied. Then, the memory device 150 can check and determine whether a program operation according to the applied program pulse passes or fails (operation 912).

After a threshold voltage distribution of the memory cells moves or shifts, as expected, in response to an applied program pulse (PASS in the operation 912), the memory device 150 can check whether the result of a previous program loop (e.g., even-numbered program loop) has succeeded or failed (operation 920). If the result of the previous program loop has succeeded (PASS in the operation 920), the memory device 150 may terminate the data program operation (operation 922). If the result of the previous program loop has failed (FAIL in the operation 920), the memory device 150 can increase the number of the program loop by 1 (operation 924). The memory device 150 checks the value of the program loop increased by 1 (e.g., an even number "2" because it is increased by 1 from the odd number of "1"), the memory device 150 can apply a program pulse set for the even-numbered program loop, and check whether a program operation according to the applied program pulse passes or fails (operation 932).

In response to the program pulse applied in the odd-numbered program loop, if the threshold voltage distribution of the memory cells does not move or shift as expected (FAIL in the operation 912), the memory device 150 may re-apply the program pulse (operation 914). The memory device 150 may verify program states (e.g., one of first to fourth program states PV1 to PV4) corresponding to the applied program pulse (operation 916). The memory device 150 may determine whether a program operation regarding a target program state corresponding to the applied program pulse has succeeded or failed and store a result in the storage space (operation 918). Thereafter, the memory device 150 may increase the number of the program loop by 1 (operation 924).

Referring to FIG. 12, like the embodiment shown in FIG. 10, the memory device 150 can divide plural program loops into two program groups (e.g., an odd-numbered program loop and an even-numbered program loop), apply a different program pulse corresponding to each group, and perform a verification operation corresponding to the applied program pulse. Further, to determine whether the data program operation terminates, the memory device 150 may check whether the previously executed even-numbered program loop succeeds if the odd-numbered program loop succeeds, or whether the previously executed odd-numbered program loop succeeds if the even-numbered program loop succeeds.

In addition, referring to FIGS. 6 and 12, the memory device 150 can commonly apply a program pulse to some memory cells to be programmed with the plural program states (e.g., PV1 to PV7) (the operation 904), so that a threshold voltage distribution regarding the corresponding memory cells is generated or shifted corresponding to the first program state PV1 closest to the erase state E0. For example, if at least one memory cell among the memory cells to be programmed with a specific program state (e.g., one of PV1 to PV7) is not programmed with the first program state (PV1) by a commonly applied program pulse, the memory device 150 could determine that a page including the at least one memory cell is defective to storing multi-bit data therein. Through this, the memory device 150 may more quickly check or determine whether a memory cell in which multi-bit data is to be stored is defective, even before all the multi-bit data is programmed in the memory cell.

Also, referring to FIGS. 6 and 12, the memory device 150 can apply, to memory cells, a program pulse in common regarding the first program state PV1 among a plurality of program states (e.g., PV1 to PV7), and then divide plural program loops into two program groups. The same number of program states (e.g., three program states, PV2 to PV4 and PV5 to PV7) can belong to each of the two program groups. As a result, it is possible to avoid excessive load on a specific program group between the two program groups including divided program loops.

Figure 13:
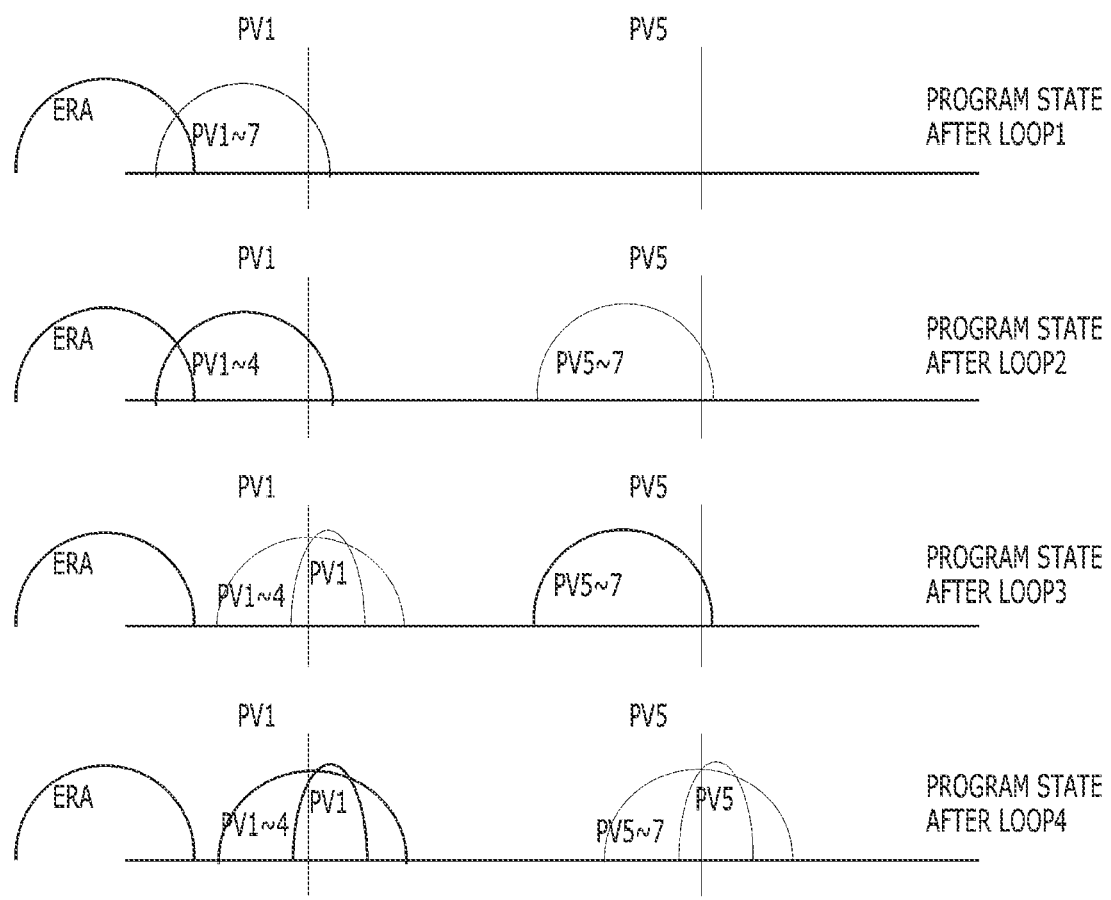
FIG. 13 illustrates cell threshold voltage distributions changed during the program operation shown in FIG. 12.

FIG. 13 illustrates an embodiment where cell threshold voltage distributions change during the program operation shown in FIG. 12.

Referring to FIGS. 12 and 13, a first program loop is an odd-numbered program loop. When the first program loop is performed, threshold voltage distributions of the memory cells to be programmed with the first to seven program states PV1 to PV7 are shifted in a right direction from the erase state ERA, except other memory cells which are maintained in the erase state ERA after the data program operation. According to an embodiment, during the first program loop, the memory device 150 can apply a program pulse (Coarse PGM) used for a coarse program operation regarding the first program state PV1.

The second program loop is the even-numbered program loop. When the second program loop is performed, there is no change in the threshold voltage distribution of the memory cells to be programmed with one of the first to fourth program states PV1 to PV4, but other threshold voltage distributions of the memory cells to be programmed with one of the fifth to seventh program states PV5 to PV7 can be shifted in the right direction from the erase state ERA to approach the fifth program state PV5. According to an embodiment, during the second program loop, the memory device 150 can apply a program pulse (Coarse PGM) used for a coarse program operation regarding the fifth program state PV5.

The third program loop is an odd-numbered program loop. When the third program loop is performed, a program pulse may be applied to some memory cells to be programmed with the first program state PV1 among the memory cells to be programmed with one of the first to fourth program states PV1 to PV4. According to an embodiment, during the third program loop, the memory device 150 can apply a program pulse (Fine PGM) used for a fine program operation regarding the first program state PV1. Accordingly, a threshold voltage distribution corresponding to the first program state PV1 may be generated and shifted. On the other hand, no change may occur in threshold voltage distributions regarding other memory cells to be programmed with one of the second to fourth program states PV2 to PV4. Also, threshold voltage distributions regarding other memory cells to be programmed with one of the fifth to seventh program states PV5 to PV7 might not be changed in a current state approaching the fifth program state PV5.

The fourth program loop is the even-numbered program loop. When the fourth program loop is performed, there is no change in the threshold voltage distribution of the memory cells to be programmed with one of the first to fourth program states PV1 to PV4, but a program pulse may be applied to some memory cells to be programmed into the fifth program state PV5 among the memory cells to be programmed with one of the fifth to seventh program states PV5 to PV7, which have been shifted in the right direction from the erase state ERA. For example, during the fourth program loop, the memory device 150 can apply a program pulse (Fine PGM) used for a fine program operation regarding the first program state PV5. Accordingly, a threshold voltage distribution corresponding to the fifth program state PV5 may be generated. On the other hand, no change may occur in other threshold voltage distributions regarding other memory cells to be programmed with one of the sixth to seventh program states PV6 to PV7.

Referring to FIGS. 12 and 13, during a data program operation, the memory device 150 may apply a common program pulse to separate some memory cells to be programmed with one of the first to seven program states PV1 to PV7 from other memory cells to be maintained in the erase state ERA in an initial program loop, and then apply different program pulses to the memory cells according to an odd-numbered program loop and an even-numbered program loop. According to an embodiment, a coarse program operation (Coarse PGM) and a fine program operation (Fine PGM) may be alternately performed in each of the odd-numbered program loop and the even-numbered program loop. The width of the threshold voltage distribution generated through the fine program operation (Fine PGM) may be narrower than the width of the threshold voltage distribution generated through the coarse program operation (Coarse PGM), even though the fine program operation (Fine PGM) and the coarse program operation (Coarse PGM) are performed for programming the same data. For example, a coarse program operation (Coarse PGM) can be performed to move or shift threshold voltage distributions to approach different program states, and a fine program operation (Fine PGM) may be performed to narrow widths of the threshold voltage distributions after the coarse program operation (Coarse PGM) is performed.

In accordance with the aforementioned embodiments, a memory device or memory system is provided where a plurality of program loops are divided into a plurality of program groups, and different program pulses corresponding to different program states are applied to memory cells in each program group. In addition, as the program pulses set for each program group are alternately applied to the memory cells, it is possible to avoid or reduce the continuous application of strong stress to neighboring memory cells located around specific memory cells to be programmed according to the program pulses. During the data program operation, the memory device or the memory system may suppress or reduce a program disturbance.

Further, an embodiment of the present disclosure can provide a memory system, a memory device, and an operation method thereof in order for improving performance of the data program operation.

Further, the memory device or the memory system can improve reliability of the data program operation regarding a specific data entry which could be vulnerable due to program disturb.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments or operations of the apparatus embodiments herein.

The controllers, processors, control circuitry, devices, modules, units, multiplexers, generators, logic, interfaces, decoders, drivers, generators and other signal generating and signal processing features of the embodiments disclosed herein may be implemented, for example, in non-transitory logic that may include hardware, software, or both. When implemented at least partially in hardware, the controllers, processors, control circuitry, devices, modules, units, multiplexers, generators, logic, interfaces, decoders, drivers, generators and other signal generating and signal processing features may be, for example, any of a variety of integrated circuits including but not limited to an application-specific integrated circuit, a field-programmable gate array, a combination of logic gates, a system-on-chip, a microprocessor, or another type of processing or control circuit.

When implemented at least partially in software, the controllers, processors, control circuitry, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

While the present teachings have been illustrated and described with respect to the specific embodiments, it will be apparent to those skilled in the art in light of the present disclosure that various changes and modifications may be made without departing from the spirit and scope of the disclosure as defined in the following claims. Furthermore, the embodiments may be combined to form additional embodiments.

What is claimed is:

1. A memory device comprising:
    plural memory cells, each of the plural memory cells capable of storing multi-bit data corresponding to an erase state and plural program states; and
    control circuitry configured to divide plural program loops, which are performed to store the multi-bit data in the plural memory cells, into plural program groups and apply different program pulses, which correspond to each of the plural program groups, to the plural memory cells, wherein the control circuitry is configured to perform the plural program loops in one or more odd numbered program loops and one or more even numbered program loops.

2. The memory device according to claim 1, further comprising:
    a voltage supply circuit configured to apply a program pulse to the plural memory cells during each of the plural program loops.

3. The memory device according to claim 1, wherein each of the plural program loops comprises:
    a first operation to control bit lines coupled to the plural memory cells;
    a second operation to apply a program pulse corresponding to one of the plural program states to the plural memory cells; and
    a third operation to verify a program state of the plural memory cells, the program state corresponding to the program pulse.

4. The memory device according to claim 1, wherein the control circuit is further configured to:
    apply a program pulse regarding a first program state group including a program state closest to the erase state among the plural program states to the plural memory cells during the one or more odd numbered program loops, and
    apply another program pulse regarding a second program state group including a program state furthest from the erase state among the plural program states to the plural memory cells during the one or more even numbered program loops.

5. The memory device according to claim 4, wherein the first program state group and the second program state group are mutually exclusive.

6. The memory device according to claim 1,
    wherein a program pulse set to program program states corresponding to LSB data of '1' among the multi-bit data is applied to the plural memory cells during the one or more odd numbered program loops, and
    wherein another program pulse set to program program states corresponding to LSB data of '0' among the multi-bit data is applied to the plural memory cells during the one or more even numbered program loops.

7. The memory device according to claim 1, wherein the control circuitry is further configured to:
    divide the plural memory cells into a first memory cell group and a second memory cell group before dividing the plural program loops into the plural program groups, wherein the first memory cell group includes a memory cell having a threshold voltage to be in the erase state and wherein the second memory cell group includes a memory cell having a threshold voltage to be in one of the plural program states; and
    apply a common program pulse corresponding to a program state closest to the erase state among the plural program states to the second memory cell group.

8. The memory device according to claim 7, wherein the control circuitry is further configured to:
    perform a verification regarding the common program pulse after applying the common program pulse to the second memory cell group; and
    determine whether the second memory cell group is defective based on a result of the verification.

9. The memory device according to claim 1, wherein a number of program states corresponding to program pulses applied during each of the plural program groups dividing the plural program loops is the same.

10. A memory system comprising:
a controller configured to determine a physical address corresponding to a write data entry and transfer the write data entry into a location corresponding to the physical address; and
a memory device configured to divide plural program loops, which are performed to store multi-bit data included in the write data entry in plural memory cells, into plural program groups and apply different program pulses, which correspond to each of the plural program groups, to the plural memory cells, wherein the memory device is configured to perform the plural program loops in one or more odd numbered program loops and one or more even numbered program loops.

11. The memory system according to claim 10,
wherein the memory device is further configured to transfer a completion notice to the controller after the multi-bit data is completely programmed in the plural memory cells, and
wherein the controller is further configured to generate a map data entry associating a logical address of the write data and the physical address.

12. The memory system according to claim 10, wherein each of the plural program loops comprises:
a first operation to control bit lines coupled to the plural memory cells;
a second operation to apply a program pulse corresponding to one of plural program states to the plural memory cells; and
a third operation to verify a program state of the plural memory cells, the program state corresponding to the program pulse.

13. The memory system according to claim 11, wherein the memory device is further configured to:
apply a program pulse regarding a first program state group including a program state closest to an erase state among plural program states to the plural memory cells during the one or more odd numbered program loops, and
apply another program pulse regarding a second program state group including a program state furthest to the erase state among the plural program states to the plural memory cells during the one or more even numbered program loops.

14. The memory system according to claim 13, wherein the first program state group and the second program state group are mutually exclusive.

15. The memory system according to claim 10,
wherein a program pulse set to program program states corresponding to LSB data of '1' among the multi-bit data is applied to the plural memory cells during the one or more odd numbered program loops, and
wherein another program pulse set to program program states corresponding to LSB data of '0' among the multi-bit data is applied to the plural memory cells during the one or more even numbered program loops.

16. The memory system according to claim 10, wherein the memory device is further configured to:
divide the plural memory cells into a first memory cell group and a second memory cell group before dividing the plural program loops into the plural program groups, wherein the first memory cell group includes a memory cell having a threshold voltage to be in an erase state and wherein the second memory cell group includes a memory cell having a threshold voltage to be in one of plural program states; and
apply a common program pulse corresponding to a program state closest to the erase state among the plural program states to the second memory cell group.

17. The memory system according to claim 16, wherein the memory device is further configured to:
perform a verification regarding the common program pulse after applying the common program pulse to the second memory cell group; and
determine whether the second memory cell group is defective based on a result of the verification.

18. A method for operating a memory device, the method comprising:
dividing plural memory cells, configured to store multi-bit data corresponding to an erase state and plural program states, into a first memory cell group and a second memory cell group, wherein the first memory cell group includes a memory cell having a threshold voltage corresponding to an erase state and the second memory cell group includes a memory cell having a threshold voltage corresponding to one of the plural program states;
applying a common program pulse to the second memory cell group;
dividing plural program loops, which are performed to store the multi-bit data in the second memory cell group, into plural program groups;
applying different program pulses, which correspond to each of the plural program groups, to the second memory cell group; and
terminating a program operation regarding the multi-bit data after verifications in the plural program groups succeed.

* * * * *